(12) United States Patent
Ohoka et al.

(10) Patent No.: US 9,363,933 B2
(45) Date of Patent: Jun. 7, 2016

(54) ELECTRICAL DEVICE

(71) Applicants: NIPPON SOKEN, INC., Nishio, Aichi-pref. (JP); DENSO CORPORATION, Kariya, Aichi-pref. (JP)

(72) Inventors: Shinji Ohoka, Okazaki (JP); Takuya Okubo, Kariya (JP); Mikihiro Ando, Chiryu (JP)

(73) Assignees: DENSO CORPORATION, Kariya (JP); NIPPON SOKEN, INC., Nishio (JP)

( * ) Notice: Subject to any disclaimer, the term of this patent is extended or adjusted under 35 U.S.C. 154(b) by 302 days.

(21) Appl. No.: 13/872,184

(22) Filed: Apr. 29, 2013

(65) Prior Publication Data

US 2013/0322021 A1    Dec. 5, 2013

(30) Foreign Application Priority Data

Jun. 1, 2012 (JP) ................. 2012-125876

(51) Int. Cl.
*H05K 7/20* (2006.01)
*H05K 9/00* (2006.01)
(Continued)

(52) U.S. Cl.
CPC ............ *H05K 9/0007* (2013.01); *H05K 5/0239* (2013.01); *H05K 7/1432* (2013.01); *H05K 7/209* (2013.01); *H05K 9/0009* (2013.01)

(58) Field of Classification Search
CPC ... H05K 5/0213; H05K 5/0239; H05K 7/209; H05K 9/0007; H05K 7/1432; H05K 9/0009
USPC .............................. 361/679.01, 688–723, 818
See application file for complete search history.

(56) References Cited

U.S. PATENT DOCUMENTS 6,265,659 B1 * 7/2001 Kaiser ................. B60R 16/0239
174/50.51
7,534,968 B2 * 5/2009 English ................ H05K 9/0032
174/382
(Continued)

FOREIGN PATENT DOCUMENTS

JP    UM-A-S60-079794    11/1983
JP    61-007097    1/1986
(Continued)

OTHER PUBLICATIONS

Office Action (2 pages) dated May 7, 2014, issued in corresponding Japanese Application No. 2012-125876 and English translation (4 pages).
(Continued)

*Primary Examiner* — Anthony Haughton
*Assistant Examiner* — Yahya Ahmad
(74) *Attorney, Agent, or Firm* — Nixon & Vanderhye P.C.

(57) ABSTRACT

An electrical device has a housing that includes a main body and a lid both of which are electrically conductive. The lid is fastened to a top surface of a sidewall of the main body so as to cover the main body. On at least one of a bottom surface of the lid and the top surface of the sidewall of the main body, there are formed a plurality of protrusions at predetermined positions; each of the protrusions abuts against that one of the bottom surface of the lid and the top surface of the sidewall which is opposed to the protrusion. Except at those predetermined positions where the protrusions are formed, there is provided, between the bottom surface of the lid and the top surface of the sidewall of the main body, a gap via which the internal and external spaces of the housing communicate with each other.

15 Claims, 15 Drawing Sheets

(51) Int. Cl.
*H05K 5/02* (2006.01)
*H05K 7/14* (2006.01)

(56) References Cited

U.S. PATENT DOCUMENTS

| | | | | |
|---|---|---|---|---|
| 2002/0126466 | A1* | 9/2002 | Suzuki | H05K 9/006 361/818 |
| 2003/0133280 | A1 | 7/2003 | Tsuzuki | |
| 2004/0120132 | A1* | 6/2004 | Kooker | H05K 9/0037 361/818 |
| 2004/0188120 | A1* | 9/2004 | Komatsu | H05K 5/061 174/17 CT |
| 2006/0262512 | A1* | 11/2006 | Klein | H05K 7/142 361/800 |
| 2008/0123316 | A1* | 5/2008 | Chen | H05K 9/0073 361/818 |
| 2008/0278918 | A1* | 11/2008 | Tominaga | B62D 5/0406 361/719 |
| 2012/0281386 | A1* | 11/2012 | Kim | H05K 9/0032 361/818 |

FOREIGN PATENT DOCUMENTS

| | | |
|---|---|---|
| JP | 05-063098 | 8/1993 |
| JP | UM-A-H05-062094 | 8/1993 |
| JP | UM-A-H06-066092 | 9/1994 |
| JP | H09237990 | 9/1997 |
| JP | B-U-3065107 | 10/1999 |
| JP | 2001-130091 A | 5/2001 |
| JP | 2003-174270 | 6/2003 |
| JP | 2003-209383 | 7/2003 |
| JP | 4608383 | 10/2010 |
| JP | 4624881 | 11/2010 |

OTHER PUBLICATIONS

Office Action (2 pgs.) dated Aug. 19, 2014 issued in corresponding Japanese Application No. 2012-125876 with an at least partial English-language translation thereof (2 pgs.).

Office Action (2 pages) dated Mar. 19, 2015 issued in corresponding Japanese Application No. 2012-125876 with English translation (2 pages).

Office Action in Japanese Patent Application No. 2012-125876 mailed Jun. 23, 2015.

* cited by examiner

ELECTRICAL DEVICE

CROSS-REFERENCE TO RELATED APPLICATION

This application is based on and claims priority from Japanese Patent Application No. 2012-125876, filed on Jun. 1, 2012, the content of which is hereby incorporated by reference in its entirety into this application.

BACKGROUND

1. Technical Field

The present invention relates to electrical devices which include a housing and electrical components received in the housing.

2. Description of the Related Art

For example, in electrical vehicles and hybrid vehicles, there are used electrical devices such as a DC-DC converter and an inverter; those electrical devices include electrical components that form an electric power supply circuit and a housing that receives the electrical components therein. Further, the housing generally has a main body and a lid both of which are electrically conductive, so as to electromagnetically shield the electrical components received in the housing. Consequently, electromagnetic noise generated by the electrical components can be prevented from leaking outside of the housing; the electrical components include, for example, at least one of a transformer, a choke coil and switching elements. As a result, it is possible to prevent the electromagnetic noise generated by the electrical components from influencing other electrical devices or components located in the vicinity of the electrical device.

Furthermore, in the housing, there may be a gap formed between the main body and the lid; thus, the electromagnetic noise generated by the electrical components may leak outside of the housing via the gap. However, in this case, if the main body and the lid are electrically connected with each other, it is still possible to electromagnetically shield the electrical components received in the housing. Therefore, in an electric power supply device disclosed in Japanese Patent No. 4624881, the lid has a plurality of raised portions (or protrusions) formed therein; via the raised portions, the main body and the lid are in partial contact with each other.

However, in the electric power supply device disclosed in the patent document, the raised portions are formed on the inner surfaces of sidewalls of the lid so as to abut against the outer surfaces of sidewalls of the main body. That is, all the directions of contact between the main body and the lid at the raised portions are perpendicular to the direction of fixing the lid to the main body. Consequently, it may be difficult to secure high contact pressure between the main body and the lid at the raised portions, and thus the contact resistance between the main body and the lid may tend to be large. As a result, the effect of electromagnetically shielding the electrical components by the housing may be lowered.

To solve the above problem, one may consider setting the distances between facing pairs of the sidewalls of the lid to be small and thereby making the contact pressure between the main body and the lid at the raised portions large. However, in this case, with the small distances between the facing pairs of the sidewalls of the lid, it would be difficult to fit the lid onto the main body, thus lowering the productivity. In addition, it would be easy for the outer surfaces of the sidewalls of the main body to be scratched or abraded by the raised portions of the lid during the fitting of the lid onto the main body.

Moreover, with the directions of contact between the main body and the lid at the raised portions perpendicular to the direction of fixing the lid to the main body, it may be difficult to stabilize the fixed state of the main body and the lid. Consequently, rattling noise may be easily caused by vibration between the main body and the lid.

Furthermore, in the electric power supply device disclosed in the patent document, the lower ends of the sidewalls of the lid are positioned close to a bottom wall of the main body. Therefore, even with gaps formed between the inner surfaces of the sidewalls of the lid and the outer surfaces of the sidewalls of the main body, it may be difficult to discharge heat generated by the electrical components outside of the housing.

More specifically, in the case of dissipating the heat generated by the electrical components via heat convection, the heat is discharged outside of the housing by discharging the high-temperature air in the internal space of the housing to the external environment via the gaps formed between the inner surfaces of the sidewalls of the lid and the outer surfaces of the sidewalls of the main body. However, with the lower ends of the sidewalls of the lid positioned close to the bottom wall of the main body, the exits of the gaps are also positioned close to the bottom wall of the main body. Consequently, it may be difficult for the high-temperature air, which ascends in the internal space of the housing, to be discharged outside of the housing via the gaps. As a result, it may be difficult to secure a high performance of the electrical device for dissipating the heat generated by the electrical components.

SUMMARY

According to an exemplary embodiment, an electrical device is provided which includes at least one electrical component, a housing and fastening means. The housing receives the at least one electrical component therein. The housing includes a main body and a lid both of which are electrically conductive. The main body has a bottom wall and a sidewall that is formed along a circumferential periphery of the bottom wall so as to stand upward from the bottom wall. The lid is fastened by the fastening means to a top surface of the sidewall of the main body so as to cover the main body. Further, on at least one of a bottom surface of the lid and the top surface of the sidewall of the main body of the housing, there are formed a plurality of protrusions at predetermined positions; each of the protrusions abuts against that one of the bottom surface of the lid and the top surface of the sidewall which is opposed to the protrusion. Except at those predetermined positions where the protrusions are formed, there is formed a gap between the bottom surface of the lid and the top surface of the sidewall of the main body, thereby allowing internal and external spaces of the housing which are separated by the sidewall of the main body to communicate with each other via the gap.

With the above configuration, the main body and the lid of the housing make contact with each other at the protrusions in the vertical direction. Moreover, the lid is fastened by the fastening means to the main body also in the vertical direction. That is, the direction of contact between the main body and the lid at the protrusions coincides with the direction of fastening the lid to the main body. Consequently, it is possible to increase the contact pressure between the main body and the lid at the protrusions, thereby lowering the contact resistance between the main body and the lid. As a result, it is possible to improve the effect of electromagnetically shielding the at least one electrical component by the housing.

Moreover, with the direction of contact between the main body and the lid at the protrusions coincident with the direction of fastening the lid to the main body, it is possible to stabilize the fixed state of the main body and the lid, thereby suppressing rattling noise caused by vibration between the main body and the lid.

Furthermore, with the gap formed between the bottom surface of the lid and the top surface of the sidewall of the main body, it is possible to effectively discharge the heat generated by the at least one electrical component during operation outside of the housing.

More specifically, in the case of dissipating the heat generated by the at least one electrical component via heat convection, the heat is discharged outside of the housing by discharging the high-temperature air in the internal space of the housing to the external space of the housing via the gap. In the exemplary embodiment, the gap is formed between the bottom surface of the lid and the top surface of the sidewall of the main body, i.e., formed on the upper side of the internal space of the housing. Consequently, it is easy for the high-temperature air, which ascends in the internal space, to be discharged outside of the housing via the gap. As a result, it is possible to secure a high performance of the electrical device for dissipating the heat generated by the at least one electrical component during operation.

In addition, since the protrusions are formed as integral parts of the lid or the main body of the housing, the parts count of the electrical device is reduced in comparison with the case of interposing additional members between the bottom surface of the lid and the top surface of the sidewall of the main body.

The electrical device may be an electric power supply (or electric power conversion) device such as a DC-DC converter or an inverter. In this case, the at least one electrical component received in the housing of the device may include at least one of a transformer, a choke coil and switching elements.

The electrical device may be used in, for example, an electrical vehicle or a hybrid vehicle.

The fastening means for fastening the lid to the top surface of the sidewall of the main body may be made up of machine screws, bolts, nuts, or rivets.

It is preferable that the at least one electrical component is fastened by second fastening means to the main body of the housing from the upper side of the main body.

In addition, the second fastening means may be made up of machine screws, bolts, nuts, or rivets.

It is preferable that the lid has a sidewall that is formed along a circumferential periphery of the lid so as to hang down from that main part of the lid which covers the main body of the housing from the upper side of the main body.

Further, it is preferable that the sidewall of the lid has a greater height than the protrusions.

Furthermore, it is preferable that the height of the sidewall of the lid is greater than or equal to 2 times the height of the protrusions. It is also preferable that the height of the sidewall of the lid is less than or equal to 20 times the height of the protrusions. It is also preferable that the height of the sidewall of the lid is less than or equal to ⅓ of a height of the sidewall of the main body.

The protrusions may be formed on the bottom surface of the lid of the housing. In this case, it is preferable that each of the protrusions is formed on the bottom surface of the lid so as to have a length in a thickness direction of the sidewall of the main body of the housing and a width in a circumferential direction of the sidewall, the length being greater than the width. It is also preferable that in the top surface of the sidewall of the main body of the housing, there are formed a plurality of recesses each of which engages with a corresponding one of the protrusions formed on the bottom surface of the lid.

Otherwise, the protrusions may be formed on the top surface of the sidewall of the main body of the housing. In this case, it is preferable that each of the protrusions is formed on the top surface of the sidewall of the main body so as to have a length in a thickness direction of the sidewall and a width in a circumferential direction of the sidewall, the length being greater than the width. It is further preferable that the length of each of the protrusions is equal to a width of the top surface of the sidewall of the main body. It is also preferable that in the bottom surface of the lid of the housing, there are formed a plurality of recesses each of which engages with a corresponding one of the protrusions formed on the top surface of the sidewall of the main body.

Preferably, the main body of the housing further has, in addition to the bottom wall and the sidewall, a partition wall that extends upward from the bottom wall so as to partition the internal space of the housing into two parts. On at least one of a top surface of the partition wall of the main body and a portion of the bottom surface of the lid which faces the top surface of the partition wall, there is formed at least one protrusion so as to abut against that one of the top surface of the partition wall and the portion of the bottom surface of the lid which is opposed to the at least one protrusion.

It is preferable that on an outside surface of the bottom wall of the main body of the housing, there are formed a plurality of fins for radiating heat generated by the at least one electrical component during operation.

BRIEF DESCRIPTION OF THE DRAWINGS

The present invention will be understood more fully from the detailed description given hereinafter and from the accompanying drawings of exemplary embodiments, which, however, should not be taken to limit the invention to the specific embodiments but are for the purpose of explanation and understanding only.

In the accompanying drawings.

DESCRIPTION OF EMBODIMENTS

Figure 1:
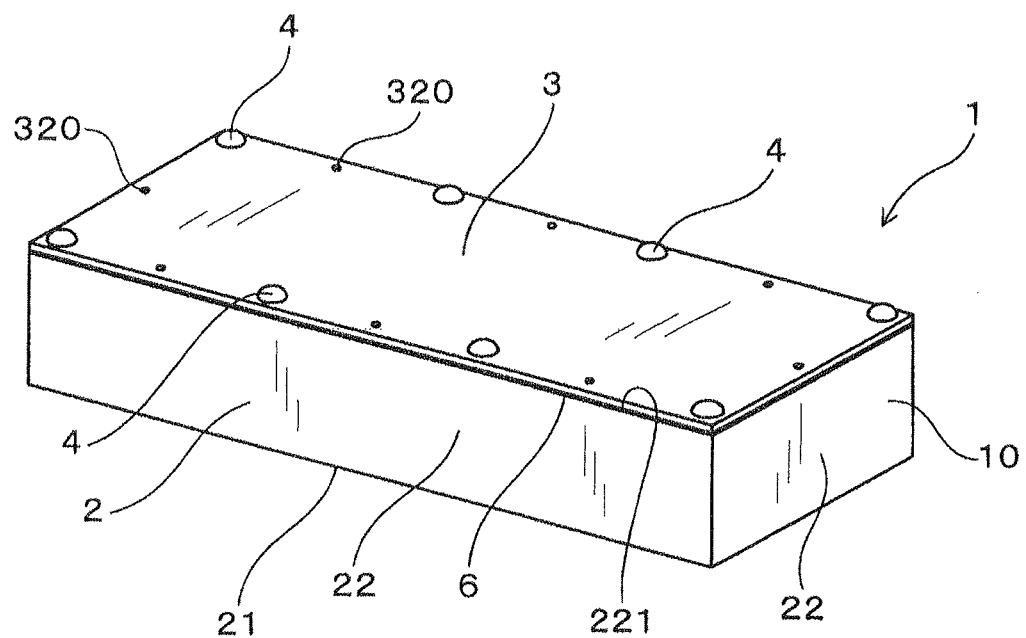
FIG. 1 is a perspective view of an electrical device according to a first embodiment.

Exemplary embodiments will be described hereinafter with reference to FIGS. 1-29. It should be noted that for the sake of clarity and understanding, identical components having identical functions throughout the whole description have been marked, where possible, with the same reference numerals in each of the figures and that for the sake of avoiding redundancy, descriptions of the identical components will not be repeated.

[First Embodiment]

Referring to FIGS. 1-5, an electrical device 1 according to a first embodiment includes a housing 10 that is comprised of a main body 2 and a lid 3, means for fastening the lid 3 to the main body 2 of the housing 10, and a plurality of electrical components 5 received in the housing 10.

Figure 2:
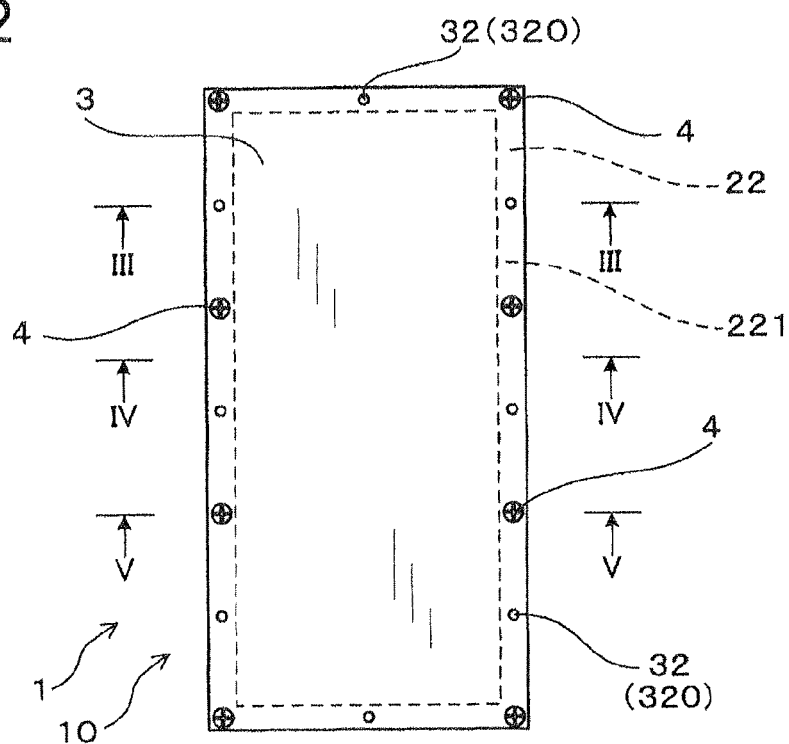
FIG. 2 is a top view of the electrical device.

The main body 2 of the housing 10 has a bottom wall 21 and a circumferential sidewall 22 that is formed along the entire circumferential periphery of the bottom wall 21 so as to stand upward from the bottom wall 21. The lid 3 is fixed to a top surface 221 of the sidewall 22 of the main body 2 so as to cover the main body 2 from the upper side. More specifically, in the present embodiment, as shown in FIGS. 1-2 and 5, the lid 3 is fastened by a plurality of machine screws 4 to the top surface 221 of the sidewall 22 of the main body 2 at a plurality of predetermined positions; the machine screws 4 together make up the means for fastening the lid 3 to the main body 2 of the housing 10. Moreover, as shown in FIGS. 3-5, the electrical components 5 are arranged in an internal space 101 of the housing 10; the internal space 101 is defined by the main body 2 and the lid 3 of the housing 10.

On at least one of a bottom surface 31 of the lid 3 and the top surface 221 of the sidewall 22 of the main body 2, there are formed a plurality of protrusions 32 at predetermined positions; each of the protrusions 32 abuts against that one of the bottom surface 31 and the top surface 221 which is opposed to the protrusion 32. More particularly, in the present embodiment, as shown in FIG. 3, the protrusions 32 are formed on the bottom surface 31 of the lid 3 so as to abut against the top surface 221 of the sidewall 22 of the main body 2.

Figure 4:
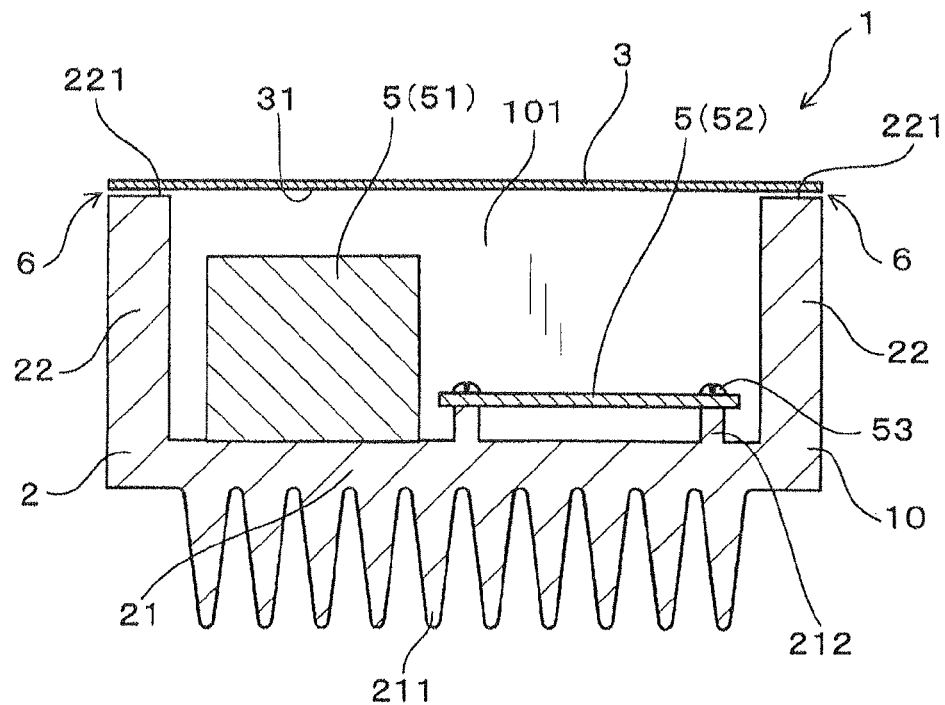
FIG. 4 is a cross-sectional view of the electrical device taken along the line IV-IV in FIG. 2.
Figure 5:
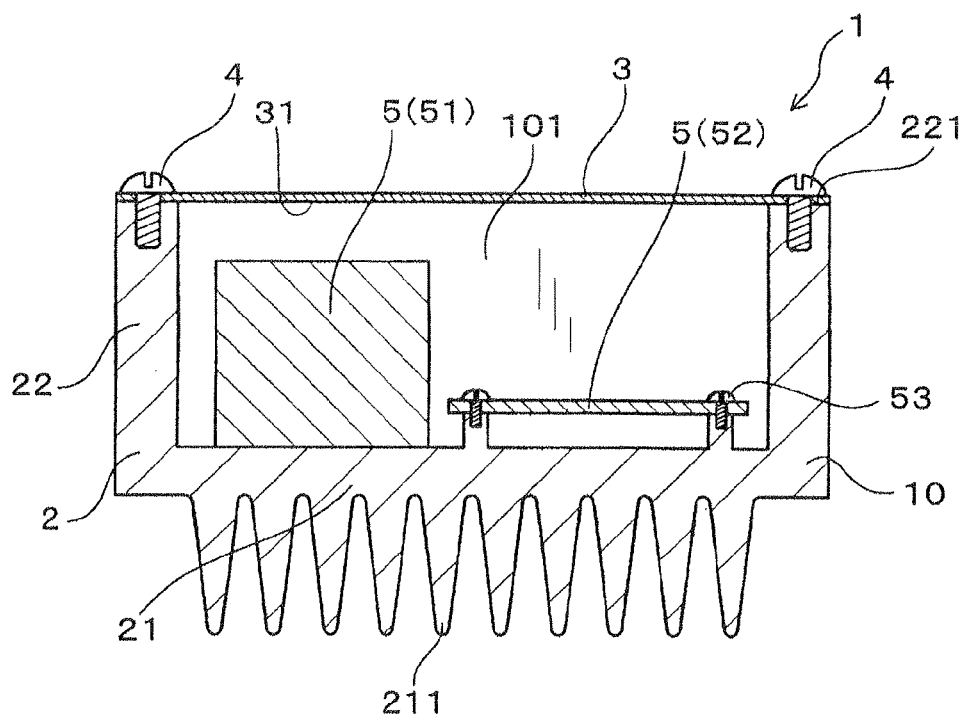
FIG. 5 is a cross-sectional view of the electrical device taken along the line V-V in FIG. 2.

Further, as shown in FIG. 4, except at those predetermined positions where the protrusions 32 are formed, there is formed a gap 6 between the bottom surface 31 of the lid 3 and the top surface 221 of the sidewall 22 of the main body 2; via the gap 6, those two spaces which are separated by the sidewall 22 of the main body 2 communicate with each other. More specifically, in the present embodiment, those two spaces respectively denote the internal space 101 formed in the housing and the external space surrounding the housing 10. Accordingly, via the gap 6, the internal space 101 and the external space of the housing 10 communicate with each other.

Figure 3:
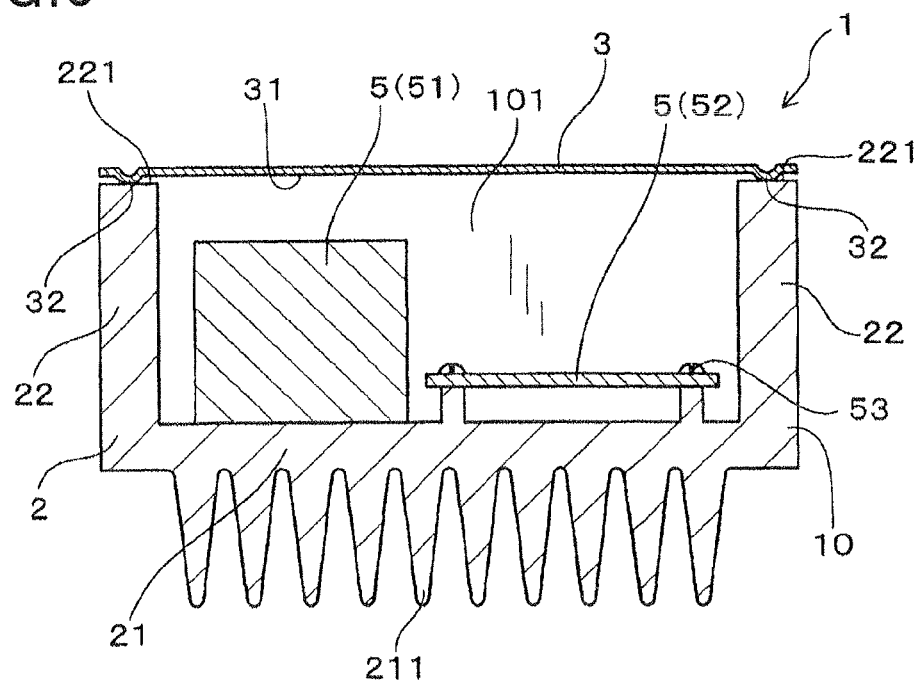
FIG. 3 is a cross-sectional view of the electrical device taken along the line in FIG. 2.

In addition, in the present embodiment, as shown in FIGS. 1-3, the protrusions 32 are formed on the bottom surface 31 of the lid 3 with respectively-mating recesses 320 formed in the top surface of the lid 3. In other words, there are formed in the lid 3 a plurality of pairs of the protrusions 32 and the recesses 320.

Figure 6:
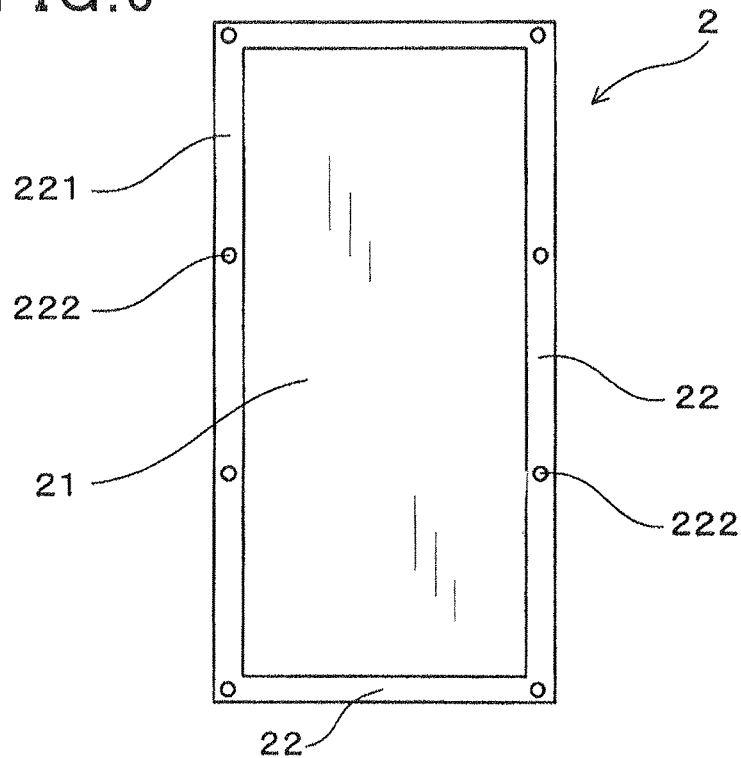
FIG. 6 is a top view of a main body of a housing of the electrical device.

The main body 2 of the housing 10 is made of an electrically-conductive metal, such as aluminum or stainless steel. As shown in FIG. 6, when viewed downward from the upper side, the bottom wall 21 of the main body 2 is rectangular in shape. The sidewall 22 of the main body 2 extends along the entire circumferential periphery of the bottom wall 21 (i.e., along all the four sides of the bottom wall 21) so as to stand upward from the bottom wall 21. In addition, as shown in FIGS. 3-5, on the outside surface of the bottom wall 21 of the main body 2, there are formed a plurality of heat-radiating fins 211 for radiating the heat generated by the electrical components 5 during operation. Consequently, the main body 2 has the shape of a substantially cuboid box that is opened on its top and has the heat-dissipating fins 211 formed on its bottom surface. In the present embodiment, the thickness of the sidewall 22 of the main body 2 is set to be in the range of, for example, 1 to 10 mm. The top surface 221 of the sidewall 22 is flat in shape and has a width equal to the thickness of the sidewall 22. Moreover, in the top surface 221 of the sidewall 22, there are formed a plurality of female-threaded holes 222, into which the machine screws 4 are respectively fastened.

Figure 7:
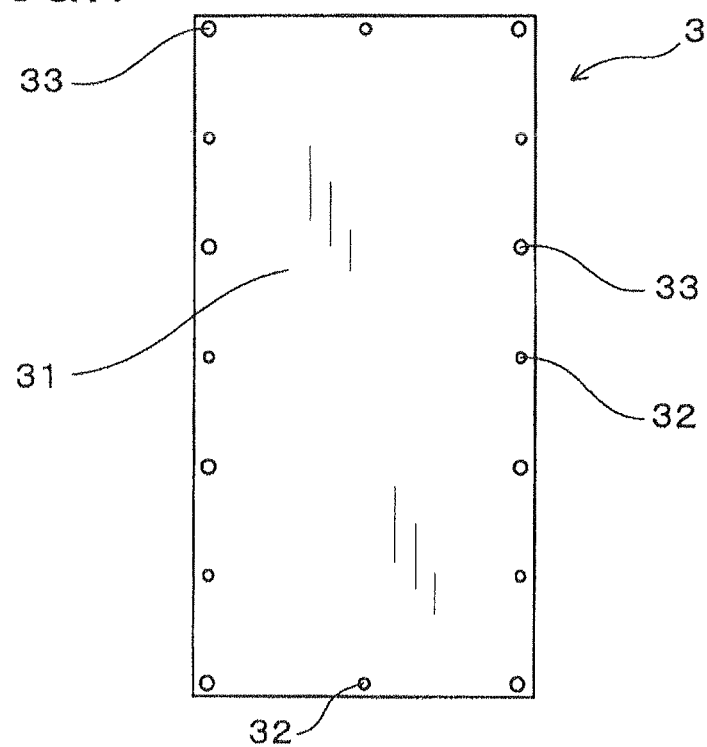
FIG. 7 is a bottom view of a lid of the housing.

The lid 3 is made of an electrically-conductive metal sheet, such as an electro-galvanized steel sheet. As shown in FIG. 7, when viewed upward from the lower side, the lid 3 has substantially the same rectangular shape and size as the bottom wall 21 of the main body 2. Further, in a circumferential peripheral portion of the lid 3, there are formed a plurality of to through-holes 33, through which the machine screws 4 are respectively passed from the upper side so as to be fastened into the female-threaded holes 222 formed in the top surface 221 of the sidewall 22 of the main body 2 (see FIG. 5). Consequently, the lid 3 is firmly fixed to the top surface 221 of the sidewall 22 of the main body 2.

Furthermore, on the bottom surface 31 of the lid 3, there are formed the protrusions 32 so as to be alternately positioned with the through-holes 33 in the circumferential peripheral portion of the lid 3. More particularly, in the present embodiment, as shown in FIG. 7, each of the protrusions 32 is formed between adjacent two of the through-holes 33 so as to be equidistant from the two adjacent through-holes 33.

The protrusions 32 have a height (i.e., a protruding height from the bottom surface 31 of the lid 3) substantially equal to the thickness of the lid 3. More particularly, in the present embodiment, the thickness of the lid 3 is set to be in the range of 0.2 to 2.0 mm. Accordingly, the height of the protrusions 32 is also in the range of 0.2 to 2.0 mm.

In addition, the intervals between the protrusions 32 are set to be in the range of 40 to 160 mm. Accordingly, the intervals between the through-holes 33 (or between the machine screws 4) are also in the range of 40 to 160 mm.

As shown in FIGS. 3-5, the electrical components 5 are received in the internal space 101 of the housing 10 which is defined by the main body 2 and the lid 3. In the present embodiment, the electrical device 1 is configured as a DC-DC converter. The electrical components 5 of the electrical device 1 accordingly include magnetic circuit-forming components 51 and an electrical circuit board 52. The magnetic circuit-forming components 51 include, for example, a transformer and a choke coil. On the other hand, on the electrical circuit board 52, there are formed electrical circuits such as a control circuit and a drive circuit. All the electrical components 5 of the electrical device 1 are fixed to the bottom wall 21 of the main body 2 of the housing 10.

More specifically, in the present embodiment, the electrical circuit board 52 is fastened by a plurality of machine screws 53 to a boss portion 212 of the main body 2 which is formed on the inside surface of the bottom wall 21; the machine screws 53 together make up means for fastening the electrical circuit board 52 to the main body 2 of the housing 10. Further, as shown in FIG. 5, the machine screws 53 as well as the machines screws 4 are fastened to the main body 2 of the housing 10 from the upper side of the main body 2. In addition, the magnetic circuit-forming components 51 are also fastened by fastening means (not shown) to the main body 2 of the housing 10 from the upper side of the main body 2.

Figure 8:
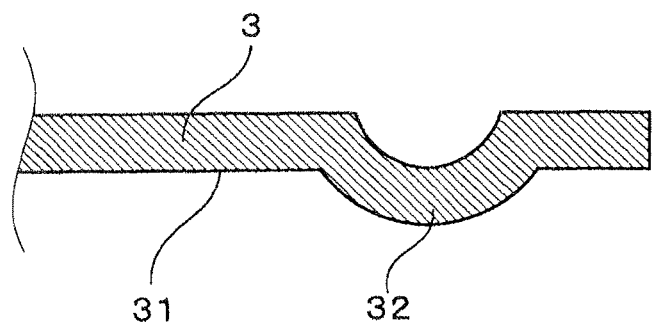
FIG. 8 is an enlarged cross-sectional view of part of the lid illustrating formation of protrusions on a bottom surface of the lid.

As shown in FIGS. 7 and 8, in the present embodiment, the protrusions 32 are formed so as to have a substantially hemispherical shape protruding from the bottom surface 31 of the lid 3. In addition, the protrusions 32 may be formed by pressing at the same time as the formation of outline of the lid 3 and the punching of the through-holes 33.

According to the present embodiment, it is possible to achieve the following advantageous effects.

In the present embodiment, the electrical device 1 includes the electrical components 5, the housing 10 and the fastening means (i.e., the machine screws 4). The housing 10 receives the electrical components 5 therein. The housing 10 includes the main body 2 and the lid 3, both of which are electrically conductive. The main body 2 has the bottom wall 21 and the circumferential sidewall 22 that is formed along the entire circumferential periphery of the bottom wall 21 so as to stand upward from the bottom wall 21. The lid 3 is fastened by the fastening means to the top surface 221 of the sidewall 22 of the main body 2 so as to cover the main body 2. Further, on the bottom surface 31 of the lid 3, there are formed the protrusions 32 at the predetermined positions; each of the protrusions 32 abuts against the top surface 221 of the sidewall 22 of the main body 2 which is opposed to the protrusions 32. Except at those predetermined positions where the protrusions 32 are formed, there is formed the gap 6 between the bottom surface 31 of the lid 3 and the top surface 221 of the sidewall 22 of the main body 2, thereby allowing the internal and external spaces of the housing 10 which are separated by the sidewall 22 of the main body 2 to communicate with each other via the gap 6.

With the above configuration, the main body 2 and the lid 3 of the housing 10 make contact with each other at the protrusions 32 in the vertical direction. Moreover, the lid 3 is fastened by the fastening means to the main body 2 also in the vertical direction. That is, the direction of contact between the main body 2 and the lid 3 at the protrusions 32 coincides with the direction of fastening the lid 3 to the main body 2. Consequently, it is possible to increase the contact pressure between the main body 2 and the lid 3 at the protrusions 32, thereby lowering the contact resistance between the main body 2 and the lid 3. As a result, it is possible to improve the effect of electromagnetically shielding the electrical components 5 by the housing 10.

Moreover, with the direction of contact between the main body 2 and the lid 3 at the protrusions 32 coincident with the direction of fastening the lid 3 to the main body 2, it is possible to stabilize the fixed state of the main body 2 and the lid 3, thereby suppressing rattling noise caused by vibration between the main body 2 and the lid 3.

Furthermore, with the gap 6 formed between the bottom surface 31 of the lid 3 and the top surface 221 of the sidewall 22 of the main body 2, it is possible to effectively discharge the heat generated by the electrical components 5 during operation outside of the housing 10.

More specifically, in the case of dissipating the heat generated by the electrical components 5 via heat convection, the heat is discharged outside of the housing 10 by discharging the high-temperature air in the internal space 101 of the housing 10 to the external space of the housing 10 via the gap 6. In the present embodiment, the gap 6 is formed between the bottom surface 31 of the lid 3 and the top surface 221 of the sidewall 22 of the main body 2, i.e., formed on the upper side of the internal space 101 of the housing 10. Consequently, it is easy for the high-temperature air, which ascends in the internal space 101, to be discharged outside of the housing 10 via the gap 6. As a result, it is possible to secure a high performance of the electrical device 1 for dissipating the heat generated by the electrical components 5 during operation.

In addition, since the protrusions 32 are formed as integral parts of the lid 3, the parts count of the electrical device 1 is reduced in comparison with the case of interposing additional members between the bottom surface 31 of the lid 3 and the top surface 221 of the sidewall 22 of the main body 2.

In the present embodiment, the electrical circuit board 52 is fastened by the machine screws 53 (i.e., the second fastening means) to the boss portion 212 of the main body 2 from the upper side of the main body 2.

With the above configuration, the direction of fastening the electrical circuit board 52 to the main body 2 of the housing 10 by the machine screws 53 coincides with the direction of fastening the lid 3 to the main body 2 by the machine screws 4. Consequently, it is possible to improve the assembly efficiency of the electrical device 1.

In the present embodiment, as described previously, the protrusions 32 are formed on the bottom surface 31 of the lid 3 of the housing 10.

With the above formation, it is possible to shape the protrusions 32 by pressing at the same time as the formation of outline of the lid 3 and the punching of the through-holes 33. As a result, the productivity of the electrical device 1 can be improved.

In the present embodiment, on the outside surface of the bottom wall 21 of the main body 2 of the housing 10, there are formed the heat-radiating fins 211 for radiating the heat generated by the electrical components 5 during operation.

Consequently, it is possible to more effectively dissipate the heat generated by the electrical components 5 during operation by both the heat convection via the gap 6 and the heat radiation via the heat-radiating fins 211.

[Second Embodiment]

This embodiment illustrates an electrical device 1 which has almost the same structure as the electrical device 1 according to the first embodiment; accordingly, only the differences therebetween will be described hereinafter.

As described previously, in the electrical device 1 according to the first embodiment, the protrusions 32 are formed on the bottom surface 31 of the lid 3 so as to have the substantially hemispherical shape (see FIG. 8). Consequently, when viewed upward from the lower side, each of the protrusions 32 has a substantially circular shape (see FIG. 7).

In comparison, in the electrical device 1 according to the present embodiment, the protrusions 32 are formed on the bottom surface 31 of the lid 3 so as to have a substantially cuboid shape. Consequently, as shown in FIGS. 9 and 10, when viewed upward from the lower side, each of the protrusions 32 is substantially rectangular-shaped to have a length a in the thickness direction of the sidewall 22 of the main body 2 and a width b in the circumferential direction of the sidewall 22, the length a being greater than the width b.

Figure 9:
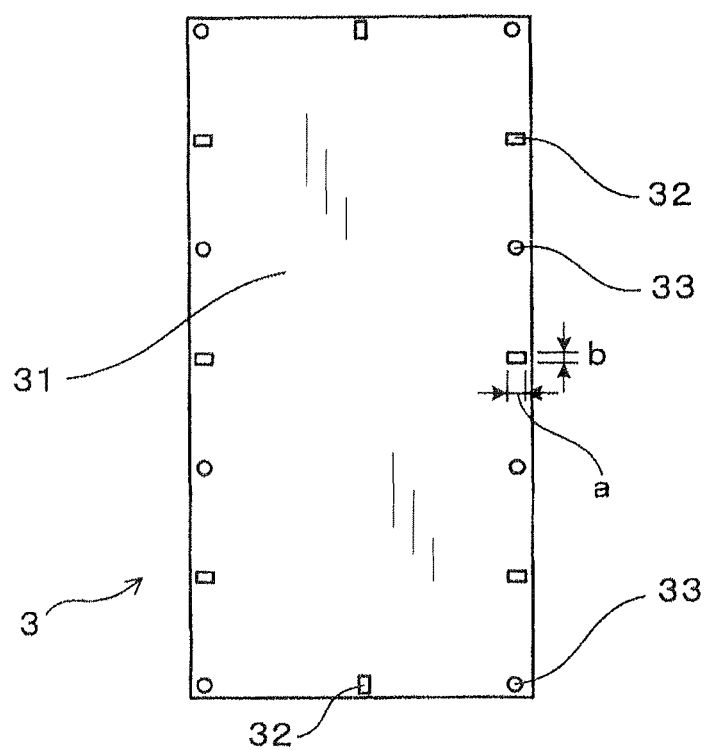
FIG. 9 is a bottom view of a lid according to a second embodiment.
Figure 10:
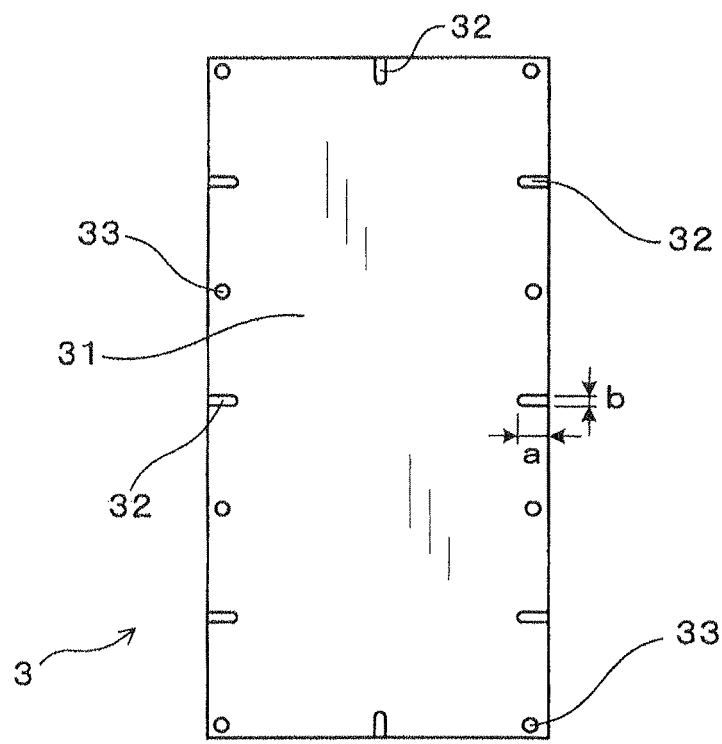
FIG. 10 is a bottom view of another lid according to the second embodiment.

Moreover, each of the protrusions 32 may be arranged on the bottom surface 31 of the lid 3 so as to be away from the peripheral edge of the lid 3 as shown in FIG. 9. Otherwise, each of the protrusions 32 may also be arranged so as to have one longitudinal end thereof positioned at the peripheral edge of the lid 3 as shown in FIG. 10.

According to the present embodiment, it is possible to achieve the following advantageous effects in addition to those achievable according to the first embodiment.

In the present embodiment, by setting the length a to be greater than the width b, it is possible to easily bring the protrusions 32 into abutment with the top surface 221 of the sidewall 22 of the main body 2. In particular, when the thickness of the sidewall 22 is small, it is still possible to reliably bring the protrusions 32 into abutment with the top surface 221 of the sidewall 22 even if there is a slight misalignment between the main body 2 and the lid 3 or a dimensional error in making the main body 2 and the lid 3.

Further, by arranging the protrusions 32 on the bottom surface 31 of the lid 3 as shown in FIG. 10, it is possible to prevent water from collecting in the recesses 320 that are formed in the top surface of the lid 3 on the opposite side to the respectively-mating protrusions 32 (see FIGS. 1-3).

In addition, the length a of the protrusions 32 may be set to be greater than the width of the top surface 221 of the sidewall 22 of the main body 2.

[Third Embodiment]

This embodiment illustrates an electrical device 1 which has almost the same structure as the electrical device 1 according to the first embodiment; accordingly, only the differences therebetween will be described hereinafter.

As described previously, in the electrical device 1 according to the first embodiment, the protrusions 32 are formed on the bottom surface 31 of the lid 3 so as to have the substantially hemispherical shape (see FIG. 8).

Figure 11:
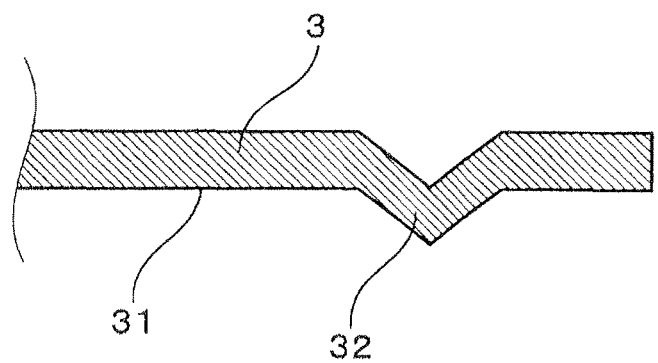
FIG. 11 is an enlarged cross-sectional view of part of a lid according a third embodiment.

In comparison, in the electrical device 1 according to the present embodiment, the protrusions 32 are formed on the bottom surface 31 of the lid 3 so as to have a substantially conical, pyramidal or triangular prismatic shape. Consequently, as shown in FIG. 11, the protrusions 32 have a substantially triangular shape in cross section.

According to the present embodiment, it is possible to achieve the following advantageous effects in addition to those achievable according to the first embodiment.

In addition, the protrusions 32 may also be formed to have various other shapes than those described above.

[Fourth Embodiment]

This embodiment illustrates an electrical device 1 which has almost the same structure as the electrical device 1 according to the first embodiment; accordingly, only the differences therebetween will be described hereinafter.

As described previously, in the electrical device 1 according to the first embodiment, the top surface 221 of the sidewall 22 of the main body 2 of the housing 10 is flat in shape (see FIGS. 3-6).

Figure 12:
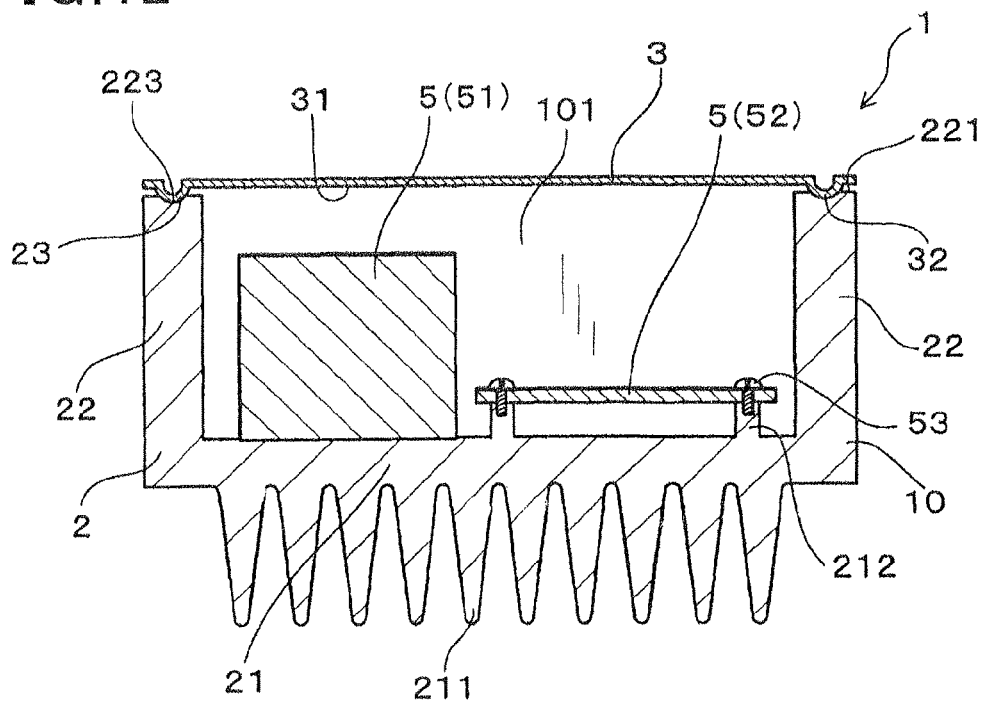
FIG. 12 is a cross-sectional view of an electrical device according to a fourth embodiment.
Figure 13:
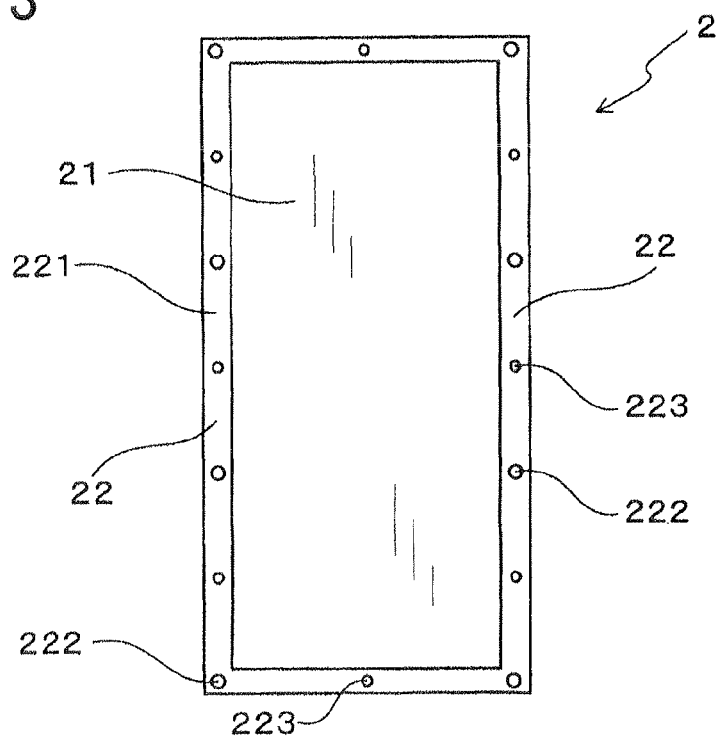
FIG. 13 is a top view of a main body of a housing of the electrical device according to the fourth embodiment.
Figure 14:
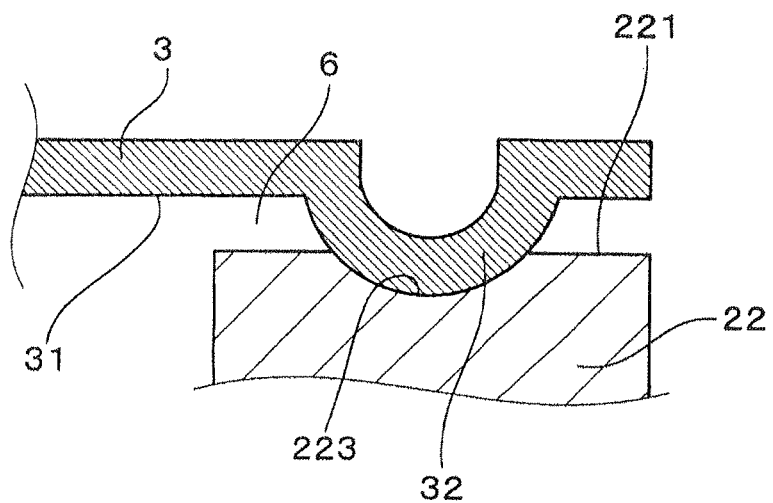
FIG. 14 is an enlarged cross-sectional view illustrating a pair of a protrusion and a recess formed in the housing of the electrical device according to the fourth embodiment.

In comparison, in the electrical device 1 according to the present embodiment, as shown in FIGS. 12-14, there are formed a plurality of recesses 223 in the top surface 221 of the sidewall 22 of the main body 2 of the housing 10; each of the recesses 223 engages with a corresponding one of the protrusions 32 formed on the bottom surface 31 of the lid 3 of the housing 10.

More specifically, as shown in FIG. 13, each of the recesses 223 is formed in the top surface 221 of the sidewall 22 of the main body 2 at a position corresponding to one of the protrusions 32 formed on the bottom surface 31 of the lid 3. Moreover, as shown in FIG. 14, each of the recesses 223 is formed so as to have a curved concave surface conformed to the hemispherical shape of the corresponding protrusion 32. Furthermore, the depth of the recesses 223 is set to be less than the height of the protrusions 32, so as to secure the gap 6 between the top surface 221 of the sidewall 22 and the bottom surface 31 of the lid 3 when the recesses 223 engage with the corresponding protrusions 32.

According to the present embodiment, it is possible to achieve the following advantageous effects in addition to those achievable according to the first embodiment.

In the present embodiment, by forming the recesses 223 in the top surface 221 of the sidewall 22 of the main body 2, it is possible to facilitate the process of fixing the lid 3 to the main body 2. More specifically, with the recesses 223, it is possible to easily and accurately position the lid 3 relative to the main body 2. In other words, it is possible to easily and accurately position the lid 3 relative to the main body 2 without employing any additional positioning means. Further, after establishing engagement between corresponding pairs of the protrusions 32 and recesses 223, it is possible to easily fasten the lid 3 to the main body 2 using the machine screws 4.

Figure 15:
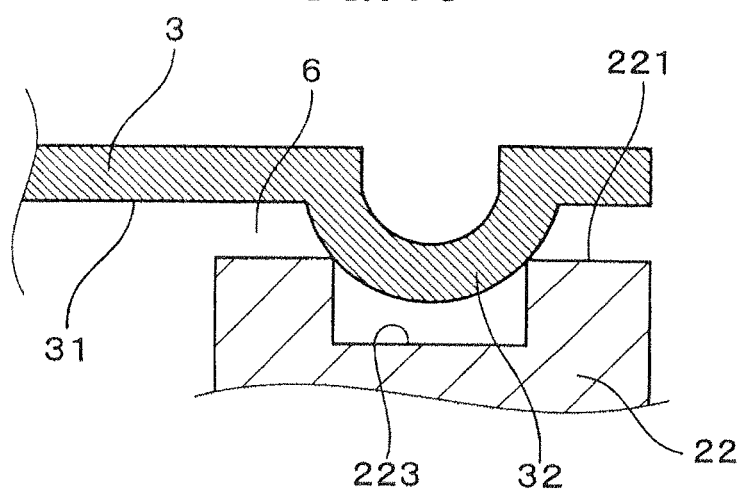
FIG. 15 is an enlarged cross-sectional view illustrating a pair of a protrusion and a recess according to a modification of the fourth embodiment.

In addition, the shape of the recesses 223 is not necessary conformed to the hemispherical shape of the protrusions 32; the depth of the recesses 223 is not necessary greater than the height of the protrusions 32. For example, the recesses 223 may be formed so as to have a substantially rectangular cross section as shown in FIG. 15. However, in any cases, it is essential to secure the gap 6 between the top surface 221 of the sidewall 22 and the bottom surface 31 of the lid 3 when the recesses 223 engage with the corresponding protrusions 32.

[Fifth Embodiment]

This embodiment illustrates an electrical device 1 which has almost the same structure as the electrical device 1 according to the first embodiment; accordingly, only the differences therebetween will be described hereinafter.

In the electrical device 1 according to the first embodiment, the lid 3 has substantially the same rectangular shape and size as the bottom wall 21 of the main body 2 (see FIGS. 1-7).

Figure 16:
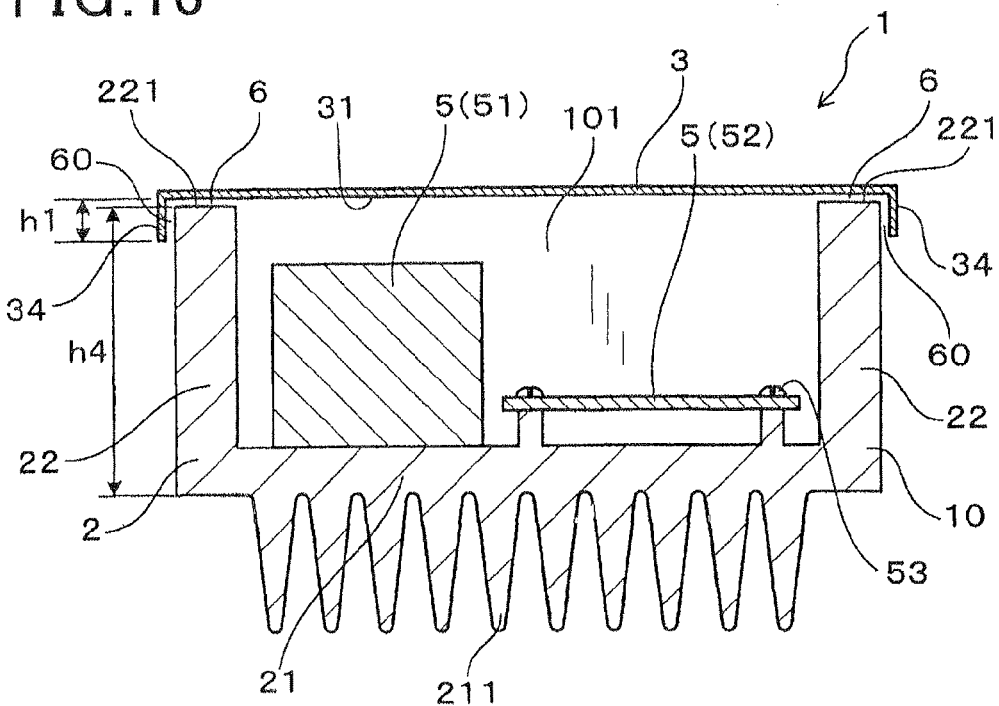
FIG. 16 is a cross-sectional view of an electrical device according to a fifth embodiment.
Figure 17:
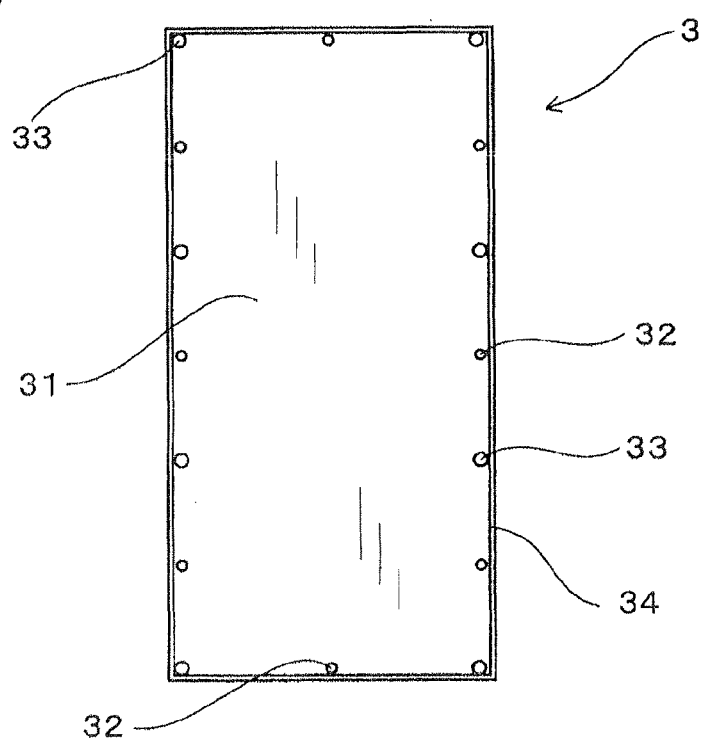
FIG. 17 is a bottom view of a lid of a housing of the electrical device according to the fifth embodiment.
Figure 18:
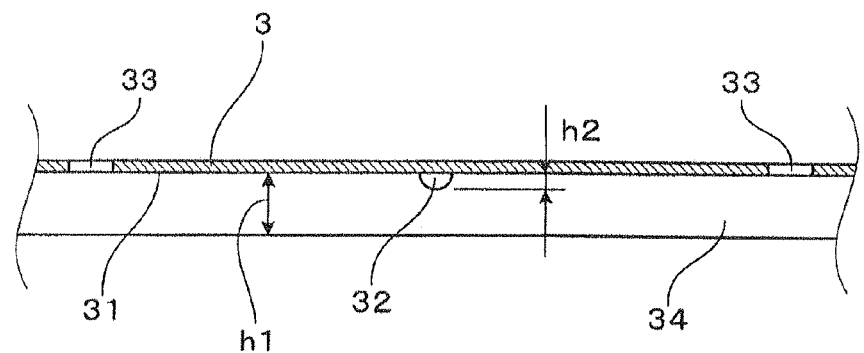
FIG. 18 is an enlarged cross-sectional view of part of the lid of FIG. 17.
Figure 19:
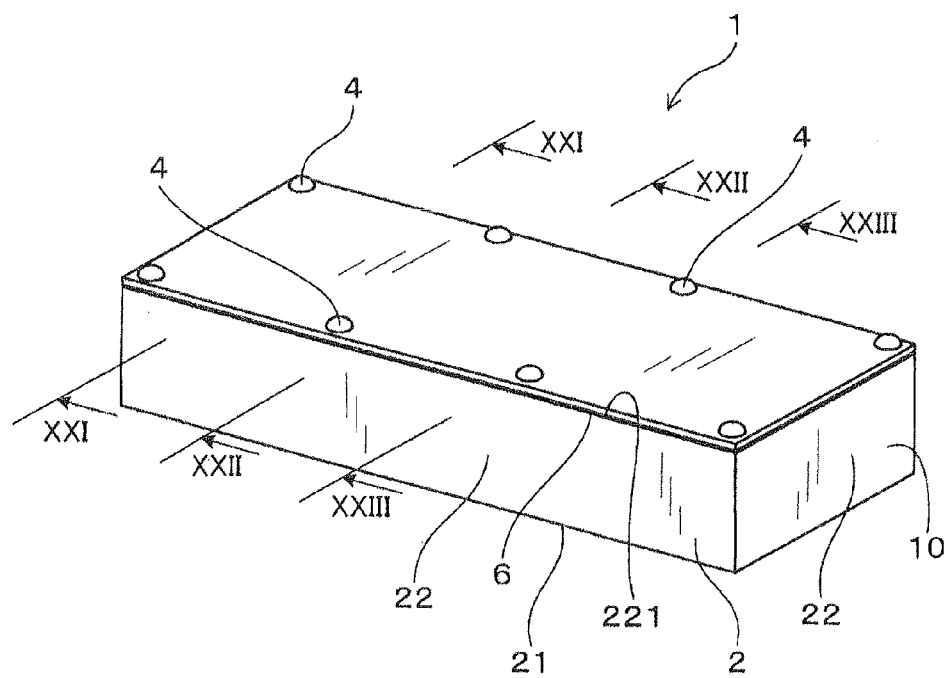
FIG. 19 is a perspective view of an electrical device according to a sixth embodiment.

In comparison, in the electrical device 1 according to the present embodiment, as shown in FIGS. 16-18, the lid 3 has a circumferential sidewall 34 that is formed along the entire circumferential periphery of the lid 3 so as to hang down from that main part of the lid 3 which covers the main body 2 of the housing 10 from the upper side of the main body 2.

Moreover, as shown in FIG. 16, the sidewall 34 of the lid 3 is arranged so as to surround an upper end portion of the sidewall 22 of the main body 2 with a gap 60 formed therebetween. The gap 60 formed between the sidewall 34 of the lid 3 and the sidewall 22 of the main body 2 is substantially equal in size to the gap 6 formed between the bottom surface 31 of the lid 3 and the top surface 221 of the sidewall 22 of the main body 2.

Further, as shown in FIG. 18, the height h1 of the sidewall 34 of the lid 3 is set to be greater than the height h2 of the protrusions 32 formed on the bottom surface 31 of the lid 3. More specifically, in the present embodiment, the height h1 of the sidewall 34 is set to be 2 to 20 times the height h2 of the protrusions 32.

Furthermore, as shown in FIG. 16, in the present embodiment, the height h1 of the sidewall 34 is set to be less than or equal to ⅓ of the height h4 of the sidewall 22 of the main body 2. Here, the height h4 of the sidewall 22 of the main body 2 is represented by the distance from the inside surface of the bottom wall 21 of the main body 2 (or the bottom surface of the internal space 101 of the housing 10) to the top surface 221 of the sidewall 22.

According to the present embodiment, it is possible to achieve the following advantageous effects in addition to those achievable according to the first embodiment.

In the present embodiment, with the sidewall 34 of the lid 3, it is possible to cover, in the horizontal direction, the gap 6 formed between the bottom surface 31 of the lid 3 and the top surface 221 of the sidewall 22 of the main body 2. Consequently, it is possible to suppress leakage of the electromagnetic noise generated by the electrical components 5 to the external space via the gap 6. As a result, it is possible to further improve the effect of electromagnetically shielding the electrical components 5 by the housing 10.

Moreover, water, which has dropped or condensed on the top surface of the lid 3, will fall down along the outer surface of the sidewall 34. Consequently, with the sidewall 34, it is possible to prevent the water from intruding into the internal space 101 of the housing 10 via the gap 6.

In the present embodiment, with the height h1 of the sidewall 34 greater than the height h2 of the protrusions 32, it is possible for the sidewall 34 to completely cover the gap 6 in the horizontal direction as shown in FIG. 16. Consequently, it is possible to more effectively suppress leakage of the electromagnetic noise generated by the electrical components 5 to the external space via the gap 6.

In addition, with the height h1 of the sidewall 34 greater than the height h2 of the protrusions 32, the sidewall 34 can be formed so as to surround the upper end portion of the sidewall 22 of the main body 2. Consequently, during the process of fixing the lid 3 to the main body 2, it is possible to easily and accurately position the lid 3 relative to the main body 2 by the sidewall 34.

Further, with the height h1 of the sidewall 34 not less than 2 times the height h2 of the protrusions 32, it is possible to allow the sidewall 34 of the lid 3 to overlap the sidewall 22 of the main body 2 in the horizontal direction. Consequently, it is possible to more effectively suppress leakage of the electromagnetic noise generated by the electrical components 5 to the external space via the gap 6.

Furthermore, with the height h1 of the sidewall 34 not greater than 20 times the height h2 of the protrusions 32, it is possible to prevent the sidewall 34 from impeding the discharge of heat from the internal space 101 to the external space of the housing 10 via the gap 6.

In addition, if the height h1 of the sidewall 34 was greater than 20 times the height h2 of the protrusions 32, the vertical length of the gap 60 formed between the sidewall 34 of the lid 3 and the sidewall 22 of the main body 2 would be too large. Consequently, it would be difficult for the heat generated by the electrical components 5 during operation to be discharged outside of the housing 10 via both the gap 6 and the gap 60.

In the present embodiment, with the height h1 of the sidewall 34 not greater than ⅓ of the height h4 of the sidewall 22 of the main body 2, it is possible to more reliably prevent the sidewall 34 from impeding the discharge of heat from the internal space 101 to the external space of the housing 10 via the gap 6.

[Sixth Embodiment]

This embodiment illustrates an electrical device 1 which has almost the same structure as the electrical device 1 according to the first embodiment; accordingly, only the differences therebetween will be described hereinafter.

As described previously, in the electrical device 1 according to the first embodiment, the protrusions 32 are formed on the bottom surface 31 of the lid 3 so as to abut against the top surface 221 of the sidewall 22 of the main body 2 (see FIG. 3).

In comparison, in the electrical device 1 according to the present embodiment, as shown in FIGS. 19-23, there are no protrusions 32 formed on the bottom surface 31 of the lid 3. Instead, a plurality of protrusions 24 are formed on the top surface 221 of the sidewall 22 of the main body 2 at predetermined positions so as to abut against the bottom surface 31 of the lid 3.

Figure 20:
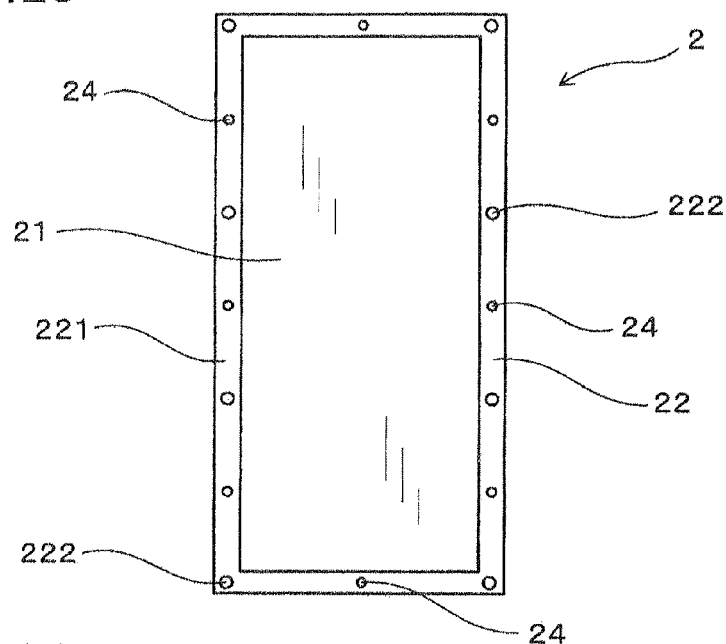
FIG. 20 is a top view of a main body of a housing of the electrical device according to the sixth embodiment.
Figure 21:
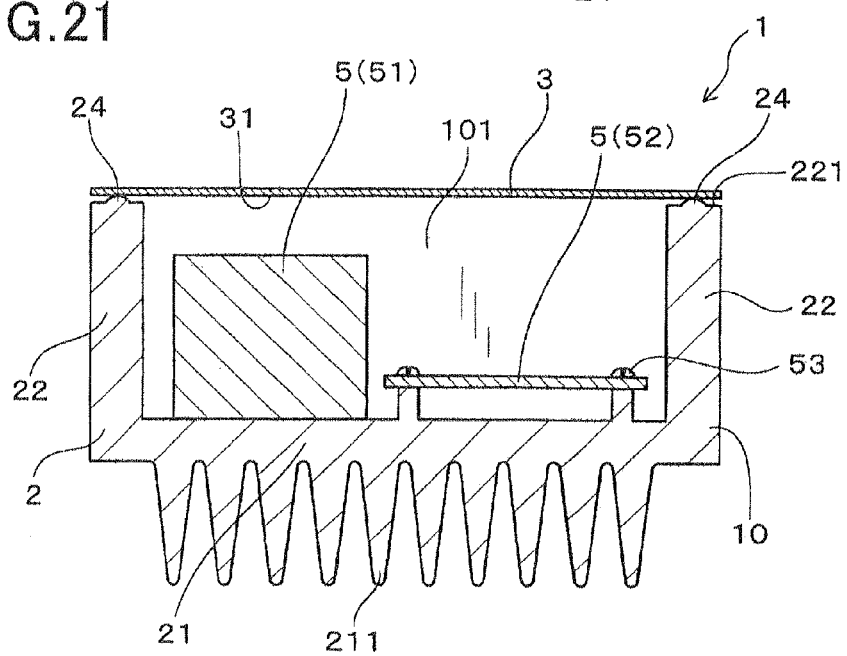
FIG. 21 is a cross-sectional view of the electrical device according to the sixth embodiment taken along the line XXI-XXI in FIG. 19.
Figure 22:
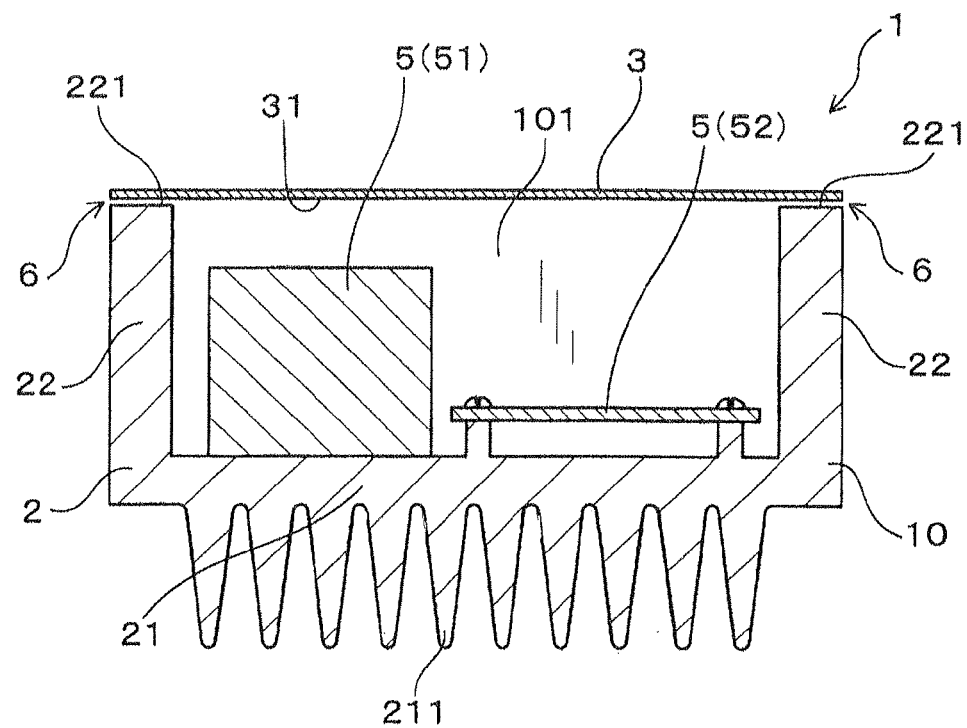
FIG. 22 is a cross-sectional view of the electrical device according to the sixth embodiment taken along the line XXII-XXII in FIG. 19.

More specifically, as shown in FIG. 20, the protrusions 24 are formed on the top surface 221 of the sidewall 22 of the main body 2 so as to be spaced from each other at predetermined intervals in the circumferential direction of the sidewall 22. Further, as shown in FIG. 21, in the fixed state of the main body 2 and lid 3 of the housing 10, each of the protrusions 24 abuts against the bottom surface 31 of the lid 3. Furthermore, as shown in FIG. 22, except at those predetermined positions where the protrusions 24 are formed, there is formed the gap 6 between the bottom surface 31 of the lid 3 and the top surface 221 of the sidewall 22 of the main body 2; via the gap 6, the internal space 101 and the external space of the housing 10 communicate with each other.

Moreover, as shown in FIG. 20, on the top surface 221 of the sidewall 22 of the main body 2, the protrusions 24 are alternately positioned with the female-threaded holes 222 in the circumferential direction of the sidewall 22. More particularly, in the present embodiment, each of the protrusions 24 is formed between adjacent two of the female-threaded holes 222 so as to be equidistant from the two female-threaded holes 222.

In the present embodiment, the protrusions 24 are formed so as to have a substantially hemispherical shape protruding from the top surface 221 of the sidewall 22 of the main body 2. However, it should be noted that the protrusions 24 may also be formed to have various other shapes, such as those shapes of the protrusions 32 which are described in the first to the fifth embodiments.

According to the present embodiment, it is possible to achieve the same advantageous effects as described in the first embodiment.

In addition, in the present embodiment, the protrusions 24 may be formed as integral parts of the main body 2 of the housing 10 by, for example, molding or machining.

[Seventh Embodiment]

This embodiment illustrates an electrical device 1 which has almost the same structure as the electrical device 1 according to the sixth embodiment; accordingly, only the differences therebetween will be described hereinafter.

As described previously, in the electrical device 1 according to the sixth embodiment, the protrusions 24 are formed on the top surface 221 of the sidewall 22 of the main body 2 so as to have the substantially hemispherical shape (see FIG. 21). Consequently, when viewed downward from the upper side, each of the protrusions 24 has a substantially circular shape (see FIG. 20).

Figure 24:
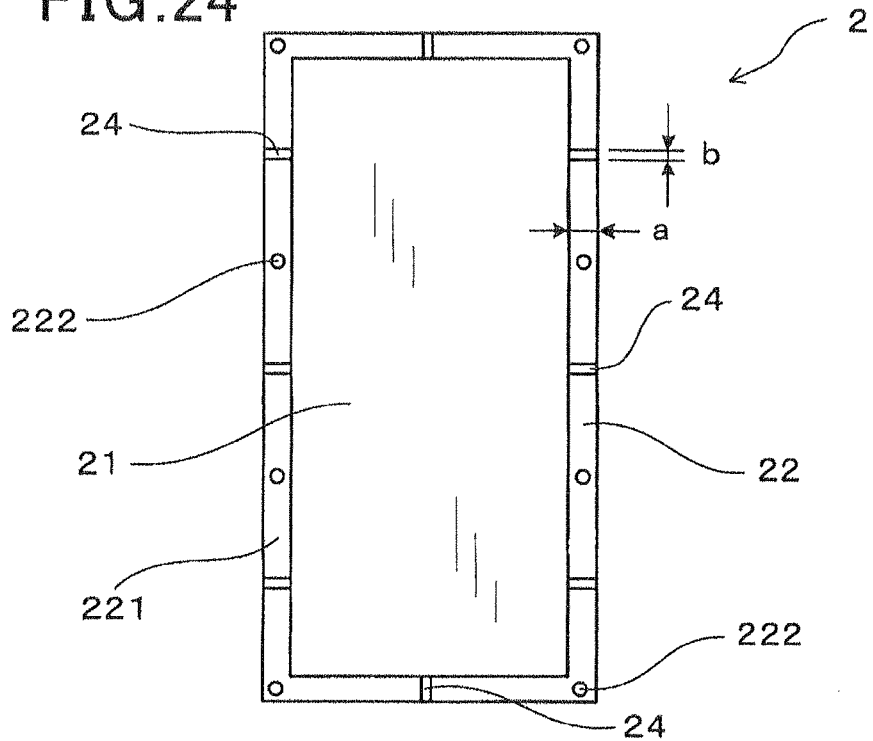
FIG. 24 is a top view of a main body of a housing of an electrical device according to a seventh embodiment.

In comparison, in the electrical device 1 according to the present embodiment, the protrusions 24 are formed on the top surface 221 of the sidewall 22 of the main body 2 so as to have a substantially cuboid shape. Consequently, as shown in FIG. 24, when viewed downward from the upper side, each of the protrusions 24 is substantially rectangular-shaped to have a length a in the thickness direction of the sidewall 22 of the main body 2 and a width b in the circumferential direction of the sidewall 22, the length a being greater than the width b.

More particularly, in the present embodiment, the length a of the protrusions 24 is set to be equal to the width of the top surface 221 of the sidewall 22. Consequently, each of the protrusions 24 has its longitudinal ends respectively positioned on the inner and outer peripheral edges of the sidewall 22.

According to the present embodiment, it is possible to achieve the following advantageous effects in addition to those achievable according to the sixth embodiment.

In the present embodiment, by setting the length a to be greater than the width b, it is possible to easily bring the protrusions 24 into abutment with the bottom surface 31 of the lid 3 even if there is a slight misalignment between the main body 2 and the lid 3 or a dimensional error in making the main body 2 and the lid 3.

Further, by setting the length a to be equal to the width of the top surface 221 of the sidewall 22, it is possible to more easily bring the protrusions 24 into abutment with the bottom surface 31 of the lid 3.

[Eighth Embodiment]

This embodiment illustrates an electrical device 1 which has almost the same structure as the electrical device 1 according to the sixth embodiment; accordingly, only the differences therebetween will be described hereinafter.

Figure 23:
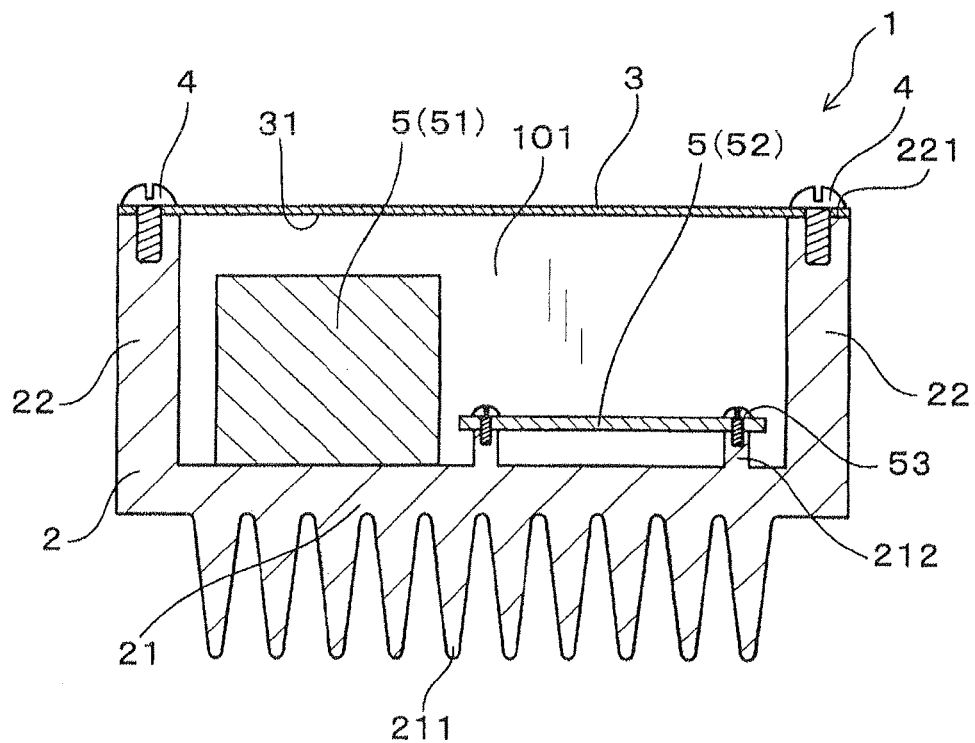
FIG. 23 is a cross-sectional view of the electrical device according to the sixth embodiment taken along the line XXIII-XXIII in FIG. 19.

In the electrical device 1 according to the sixth embodiment, the bottom surface 31 of the lid 3 of the housing 10 is flat in shape (see FIGS. 21-23).

Figure 25:
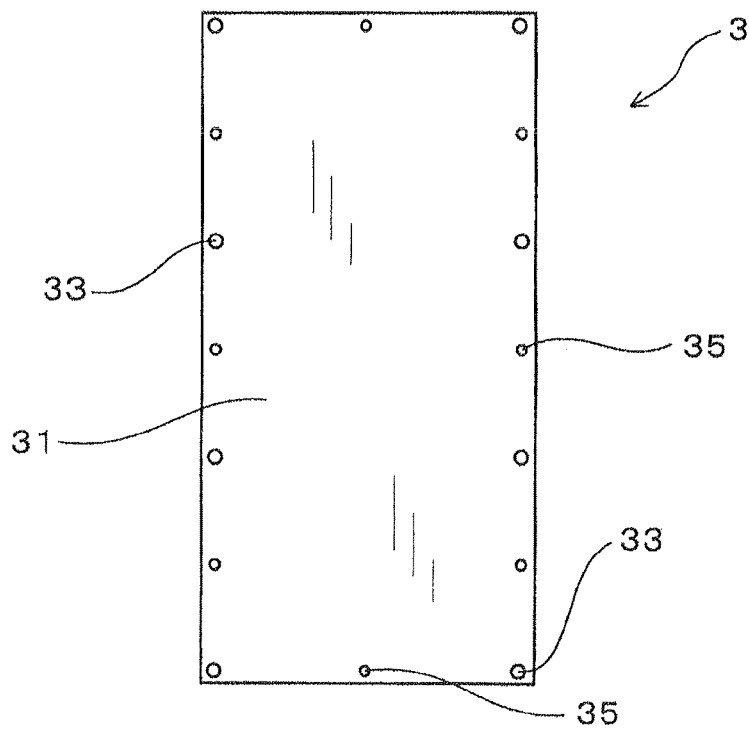
FIG. 25 is a bottom view of a lid of a housing of an electrical device according to an eighth embodiment.
Figure 26:
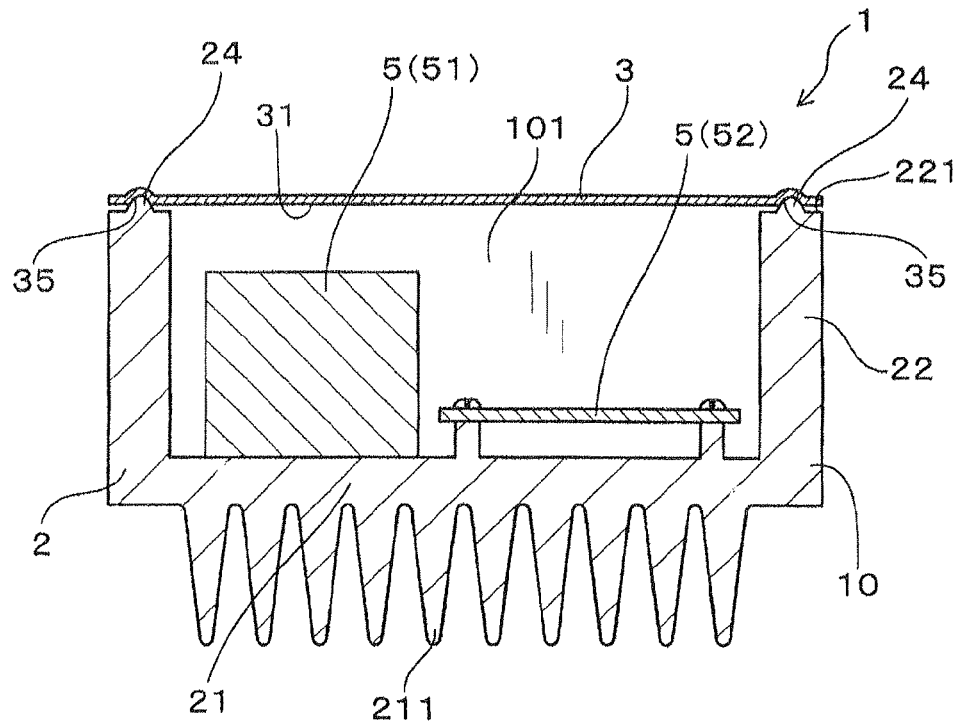
FIG. 26 is a cross-sectional view of the electrical device according to the eighth embodiment.

In comparison, in the electrical device 1 according to the present embodiment, as shown in FIGS. 25 and 26, there are formed a plurality of recesses 35 in the bottom surface 31 of the lid 3 of the housing 10; each of the recesses 35 engages with a corresponding one of the protrusions 24 formed on the top surface 221 of the sidewall 22 of the main body 2.

More specifically, as shown in FIG. 25, each of the recesses 35 is formed in the bottom surface 31 of the lid 3 at a position corresponding to one of the protrusions 24 formed on the top surface 221 of the sidewall 22 of the main body 2. Moreover, as shown in FIG. 26, each of the recesses 35 is formed so as to have a curved concave surface conformed to the hemispherical shape of the corresponding protrusion 24. Furthermore, the depth of the recesses 35 is set to be less than the height of the protrusions 24, so as to secure the gap 6 between the top surface 221 of the sidewall 22 and the bottom surface 31 of the lid 3 when the recesses 35 engage with the corresponding protrusions 24.

According to the present embodiment, it is possible to achieve the following advantageous effects in addition to those achievable according to the sixth embodiment.

In the present embodiment, by forming the recesses 35 in the bottom surface 31 of the lid 3, it is possible to facilitate the process of fixing the lid 3 to the main body 2. More specifically, with the recesses 35, it is possible to easily and accurately position the lid 3 relative to the main body 2. In other words, it is possible to easily and accurately position the lid 3 relative to the main body 2 without employing any additional positioning means. Further, after establishing engagement between corresponding pairs of the protrusions 24 and recesses 35, it is possible to easily fasten the lid 3 to the main body 2 using the machine screws 4.

In addition, the shape of the recesses 35 is not necessary conformed to the hemispherical shape of the protrusions 24; the depth of the recesses 35 is not necessary greater than the height of the protrusions 24. However, in any cases, it is essential to secure the gap 6 between the top surface 221 of the sidewall 22 of the main body 2 and the bottom surface 31 of the lid 3 when the recesses 35 engage with the corresponding protrusions 24.

[Ninth Embodiment]

This embodiment illustrates an electrical device 1 which has almost the same structure as the electrical device 1 according to the sixth embodiment; accordingly, only the differences therebetween will be described hereinafter.

In the electrical device 1 according to the sixth embodiment, the bottom surface 31 of the lid 3 of the housing 10 is flat in shape (see FIGS. 21-23).

Figure 27:
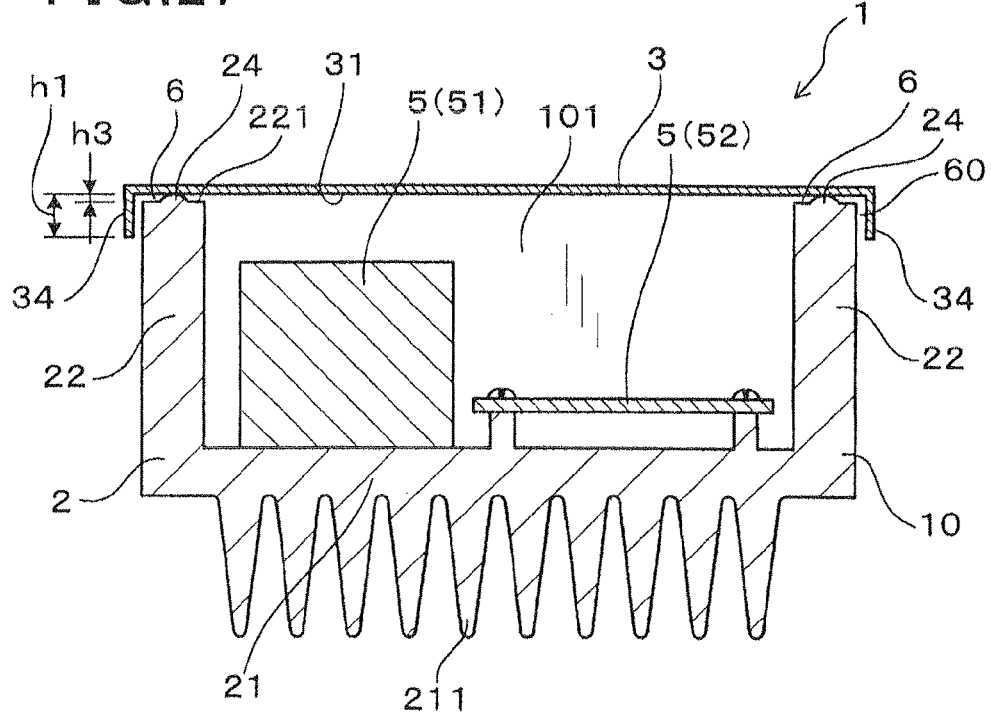
FIG. 27 is a cross-sectional view of an electrical device according to a ninth embodiment.

In comparison, in the electrical device 1 according to the present embodiment, as shown in FIG. 27, the lid 3 has a circumferential sidewall 34 that is formed along the entire circumferential periphery of the lid 3 so as to hang down from that main part of the lid 3 which covers the main body 2 of the housing 10 from the upper side of the main body 2.

Moreover, the sidewall 34 of the lid 3 is arranged so as to surround an upper end portion of the sidewall 22 of the main body 2 with a gap 60 formed therebetween. The gap 60 formed between the sidewall 34 of the lid 3 and the sidewall 22 of the main body 2 is substantially equal in size to the gap 6 formed between the bottom surface 31 of the lid 3 and the top surface 221 of the sidewall 22 of the main body 2.

Further, the height h1 of the sidewall 34 of the lid 3 is set to be greater than the height h3 of the protrusions 24 formed on the top surface 221 of the sidewall 22 of the main body 2. More specifically, in the present embodiment, the height h1 of the sidewall 34 is set to be 2 to 20 times the height h3 of the protrusions 24.

According to the present embodiment, it is possible to achieve the following advantageous effects in addition to those achievable according to the sixth embodiment.

In the present embodiment, with the sidewall 34 of the lid 3, it is possible to cover, in the horizontal direction, the gap 6 formed between the bottom surface 31 of the lid 3 and the top surface 221 of the sidewall 22 of the main body 2. Consequently, it is possible to suppress leakage of the electromagnetic noise generated by the electrical components 5 to the external space via the gap 6. As a result, it is possible to further improve the effect of electromagnetically shielding the electrical components 5 by the housing 10.

Moreover, water, which has dropped or condensed on the top surface of the lid 3, will fall down along the outer surface of the sidewall 34. Consequently, with the sidewall 34, it is possible to prevent the water from intruding into the internal space 101 of the housing 10 via the gap 6.

In the present embodiment, with the height h1 of the sidewall 34 greater than the height h3 of the protrusions 24, it is possible for the sidewall 34 to completely cover the gap 6 in the horizontal direction. Consequently, it is possible to more effectively suppress leakage of the electromagnetic noise generated by the electrical components 5 to the external space via the gap 6.

In addition, with the height h1 of the sidewall 34 greater than the height h3 of the protrusions 24, the sidewall 34 can be formed so as to surround the upper end portion of the sidewall 22 of the main body 2. Consequently, during the process of fixing the lid 3 to the main body 2, it is possible to easily and accurately position the lid 3 relative to the main body 2 by the sidewall 34.

Further, with the height h1 of the sidewall 34 not less than 2 times the height h3 of the protrusions 24, it is possible to allow the sidewall 34 of the lid 3 to overlap the sidewall 22 of the main body 2 in the horizontal direction. Consequently, it is possible to more effectively suppress leakage of the electromagnetic noise generated by the electrical components 5 to the external space via the gap 6.

Furthermore, with the height h1 of the sidewall 34 not greater than 20 times the height h3 of the protrusions 24, it is possible to prevent the sidewall 34 from impeding the discharge of heat from the internal space 101 to the external space of the housing 10 via the gap 6.

In addition, if the height h1 of the sidewall 34 was greater than 20 times the height h3 of the protrusions 24, the vertical length of the gap 60 formed between the sidewall 34 of the lid 3 and the sidewall 22 of the main body 2 would be too large. Consequently, it would be difficult for the heat generated by the electrical components 5 during operation to be discharged outside of the housing 10 via both the gap 6 and the gap 60.

[Tenth Embodiment]

This embodiment illustrates an electrical device 1 which has almost the same structure as the electrical device 1 according to the first embodiment; accordingly, only the differences therebetween will be described hereinafter.

As described previously, in the first embodiment, the main body 2 of the housing 10 has only the bottom wall 21 and the circumferential sidewall 22 that is formed along the entire circumferential periphery of the bottom wall 21 so as to stand upward from the bottom wall 21 (see FIGS. 3-6).

In comparison, in the electrical device 1 according to the present embodiment, the main body 2 of the housing 10 further has, in addition to the bottom wall 21 and the sidewall 22, a partition wall 229 that extends upward from the bottom wall 21 so as to partition the internal space 101 of the housing 10 into two equal parts 102.

Moreover, in the present embodiment, on the bottom surface 31 of the lid 3, there are formed not only those protrusions 32 which abut against the sidewall 22 of the main body 2 but also at least one protrusion 32 which abuts against the partition wall 229 of the main body 2.

According to the present embodiment, it is possible to achieve the following advantageous effects in addition to those achievable according to the first embodiment.

In the present embodiment, the main body 2 of the housing 10 has the partition wall 29 that partitions the internal space 101 of the housing 10 into the two equal parts 102. Consequently, with the partition wall 229, it is possible to prevent the electromagnetic noise generated by those of the electrical components 5 which are located in one of the two parts 102 of the internal space 101 from influencing the other electrical components 5 which are located in the other part 102 of the internal space 101.

Figure 28:
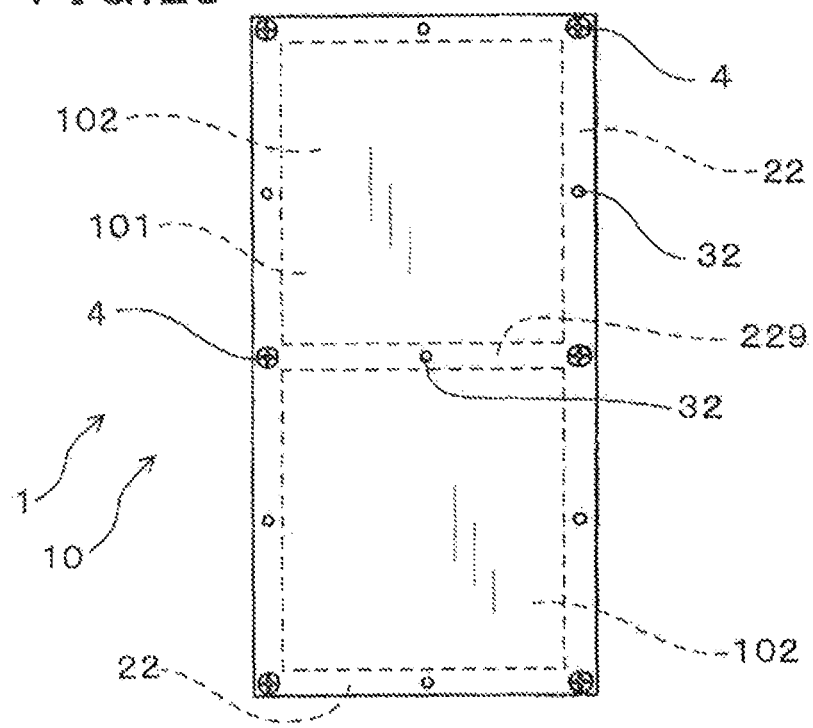
FIG. 28 is a top view of an electrical device according to a tenth embodiment.

In addition, in FIG. 28, there is shown no machine screw 4 for fastening the lid 3 to the partition wall 229 of the main body 2. However, the fastening means for fastening the lid 3 to the main body 2 may further include at least one machine screw 4 for fastening the lid 3 to the partition wall 229 of the main body 2 in addition to those machine screws 4 for fastening the lid 3 to the sidewall 22 of the main body 2.

Moreover, in the present embodiment, the protrusions 32 are formed on the bottom surface 31 of the lid 3. However, instead of forming the protrusions 32 on the bottom surface 31 of the lid 3, it is possible to form a plurality of protrusions 24 (not shown) on both the top surfaces of the sidewall 22 and partition wall 229 of the main body 2.

[Eleventh Embodiment]

This embodiment illustrates an electrical device 1 which has a similar structure to those according to the first and sixth embodiments; accordingly, only the differences therebetween will be described hereinafter.

As described previously, in the electrical device 1 according to the first embodiment, the protrusions 32 are formed on the bottom surface 31 of the lid 3 so as to abut against the top surface 221 of the sidewall 22 of the main body 2 (see FIG. 3). On the other hand, in the electrical device 1 according to the sixth embodiment, the protrusions 24 are formed on the top surface 221 of the sidewall 22 of the main body 2 so as to abut against the bottom surface 31 of the lid 3 (see FIG. 21).

Figure 29:
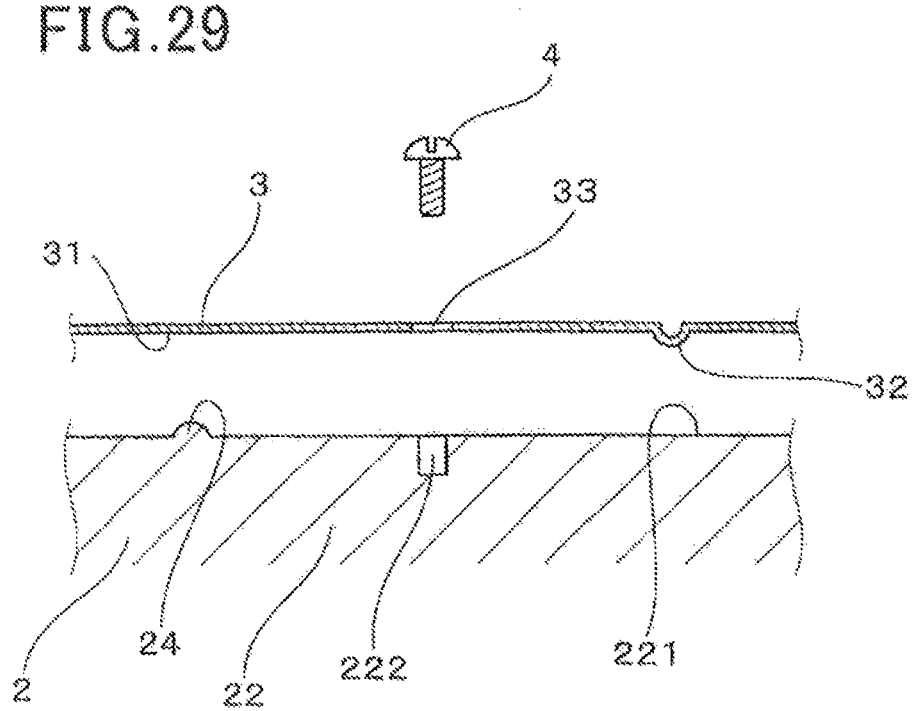
FIG. 29 is a schematic cross-sectional view illustrating the configuration of a housing of an electrical device according to an eleventh embodiment.

In comparison, in the electrical device 1 according to the present embodiment, as shown in FIG. 29, there are formed protrusions on both the bottom surface 31 of the lid 3 and the top surface 221 of the sidewall 22 of the main body 2. More specifically, on the bottom surface 31 of the lid 3, there are formed a plurality of protrusions 32 each of which abuts against the top surface 221 of the sidewall 22 of the main body 2, as in the first embodiment. Further, on the top surface 221 of the sidewall 22, there are formed a plurality of protrusions 24 each of which abuts against the bottom surface 31 of the lid 3, as in the sixth embodiment.

Moreover, the protrusions 32 are arranged so as not to make contact with the protrusions 24. More particularly, in the present embodiment, as shown in FIG. 29, the protrusions 32 are alternately arranged with the protrusions 24 so that between each adjacent pair of the protrusions 32 and 24, there is interposed a corresponding pair of the through-holes 33 formed in the lid 3 and the female-threaded holes 222 formed in the sidewall 22 of the main body 2.

In addition, it should be noted that FIG. 29 illustrates part of the main body 2 and part of the lid 3 before they are fastened together.

According to the present embodiment, it is possible to achieve the same advantageous effects as according to the first and sixth embodiments.

While the above particular embodiments have been shown and described, it will be understood by those skilled in the art that various modifications, changes, and improvements may be made without departing from the spirit of the invention.

For example, it is possible to combine the structures of the electrical devices 1 according to the second and the fifth embodiments, thereby resulting in an electrical device 1 in which: the lid 3 has the sidewall 34 as shown in FIG. 16; and the protrusions 32 formed on the bottom surface 31 of the lid 3 have either of the shapes shown in FIGS. 9 and 10. Consequently, the resultant electrical device 1 would have the advantages of both the electrical devices 1 according to the second and fifth embodiments.

In addition, it is also possible to combine the structures of the electrical devices 1 according to the first to the eleventh embodiments in any other suitable ways.

What is claimed is:

1. An electrical device comprising:
at least one electrical component;
a housing that receives the at least one electrical component therein, the housing including a main body and a lid both of which are electrically conductive, the main body having a bottom wall and a sidewall that is formed along a circumferential periphery of the bottom wall so as to stand upward from the bottom wall, the lid being fastened to a top surface of the sidewall of the main body so as to cover the main body; and
means for fastening the lid to the top surface of the sidewall of the main body of the housing,
wherein
on at least one of a bottom surface of the lid and the top surface of the sidewall of the main body of the housing, there are formed a plurality of protrusions at predetermined positions, each of the protrusions abutting against that one of the bottom surface of the lid and the top surface of the sidewall which is opposed to the protrusion, and
except at those predetermined positions where the protrusions are formed, there is formed a gap between the bottom surface of the lid and the top surface of the sidewall of the main body, thereby allowing internal and external spaces of the housing which are separated by the sidewall of the main body to communicate with each other via the gap,
wherein
a direction of contact between the main body and the lid at the protrusions coincides with a direction of fastening the lid to the main body, wherein the means for fastening contacts the top surface of the sidewall of the main body of the housing.

2. The electrical device as set forth in claim 1, wherein the at least one electrical component is fastened by second fastening means to the main body of the housing from the upper side of the main body.

3. The electrical device as set forth in claim 1, wherein the lid has a sidewall that is formed along a circumferential periphery of the lid so as to hang down from that main part of the lid which covers the main body of the housing from the upper side of the main body.

4. The electrical device as set forth in claim 3, wherein the sidewall of the lid has a greater height than the protrusions.

5. The electrical device as set forth in claim 4, wherein the height of the sidewall of the lid is greater than or equal to 2 times the height of the protrusions.

6. The electrical device as set forth in claim 4, wherein the height of the sidewall of the lid is less than or equal to 20 times the height of the protrusions.

7. The electrical device as set forth in claim 1, wherein the protrusions are formed on the bottom surface of the lid of the housing.

8. The electrical device as set forth in claim 7, wherein each of the protrusions is formed on the bottom surface of the lid so as to have a length in a thickness direction of the sidewall of the main body of the housing and a width in a circumferential direction of the sidewall, the length being greater than the width.

9. The electrical device as set forth in claim 7, wherein in the top surface of the sidewall of the main body of the housing, there are formed a plurality of recesses each of which engages with a corresponding one of the protrusions formed on the bottom surface of the lid.

10. The electrical device as set forth in claim 1, wherein the protrusions are formed on the top surface of the sidewall of the main body of the housing.

11. The electrical device as set forth in claim 10, wherein each of the protrusions is formed on the top surface of the sidewall of the main body so as to have a length in a thickness direction of the sidewall and a width in a circumferential direction of the sidewall, the length being greater than the width.

12. The electrical device as set forth in claim 11, wherein the length of each of the protrusions is equal to a width of the top surface of the sidewall of the main body.

13. The electrical device as set forth in claim 10, wherein in the bottom surface of the lid of the housing, there are formed a plurality of recesses each of which engages with a corresponding one of the protrusions formed on the top surface of the sidewall of the main body.

14. The electrical device as set forth in claim 1, wherein the main body of the housing further has, in addition to the bottom wall and the sidewall, a partition wall that extends upward from the bottom wall so as to partition the internal space of the housing into two parts, and
on at least one of a top surface of the partition wall of the main body and a portion of the bottom surface of the lid which faces the top surface of the partition wall, there is formed at least one protrusion so as to abut against that one of the top surface of the partition wall and the portion of the bottom surface of the lid which is opposed to the at least one protrusion.

15. The electrical device as set forth in claim 1, wherein on an outside surface of the bottom wall of the main body of the housing, there are formed a plurality of fins for radiating heat generated by the at least one electrical component during operation.

* * * * *